US007501607B2

(12) United States Patent
Camm et al.

(10) Patent No.: US 7,501,607 B2
(45) Date of Patent: Mar. 10, 2009

(54) APPARATUSES AND METHODS FOR SUPPRESSING THERMALLY-INDUCED MOTION OF A WORKPIECE

(75) Inventors: David Malcolm Camm, Vancouver (CA); Mladen Bumbulovic, Vancouver (CA); Joseph Cibere, Burnaby (CA); J. Kiefer Elliott, Vancouver (CA); Steve McCoy, Burnaby (CA); Greg Stuart, Burnaby (CA)

(73) Assignee: Mattson Technology Canada, Inc., Vancouver (CA)

( * ) Notice: Subject to any disclaimer, the term of this patent is extended or adjusted under 35 U.S.C. 154(b) by 0 days.

(21) Appl. No.: 11/018,388

(22) Filed: Dec. 20, 2004

(65) Prior Publication Data

US 2005/0133167 A1 Jun. 23, 2005

Related U.S. Application Data

(63) Continuation-in-part of application No. 10/742,575, filed on Dec. 19, 2003.

(60) Provisional application No. 60/568,685, filed on May 7, 2004.

(51) Int. Cl.
*H05B 6/80* (2006.01)
(52) U.S. Cl. .................. 219/679; 392/416; 219/390
(58) Field of Classification Search ................ 219/679, 219/390, 411, 405; 392/416, 418, 423, 424; 118/50.1, 724, 725, 72.4
See application file for complete search history.

(56) References Cited

U.S. PATENT DOCUMENTS

| 1,587,023 | A | 6/1926 | Mottlau ................. 99/339 |
| RE24,296 | E | 3/1957 | Stewart ................. 219/410 |
| 2,981,819 | A | 4/1961 | Gregory ................. 219/405 |
| 3,047,438 | A | 7/1962 | Marinace ................. 117/91 |
| 3,108,173 | A | 10/1963 | Barrett et al. ................. 99/389 |
| 3,160,517 | A | 12/1964 | Jenkin ................. 427/585 |
| 3,213,827 | A | 10/1965 | Jenkin ................. 118/725 |
| 3,227,065 | A | 1/1966 | Litman ................. 99/241 |
| 3,239,651 | A | 3/1966 | Silberman ................. 219/388 |

(Continued)

FOREIGN PATENT DOCUMENTS

CA 2339359 2/2000

(Continued)

OTHER PUBLICATIONS

International Preliminary Report on Patentability for PCT/CA2004/002155, mailed Jun. 29, 2006.

(Continued)

*Primary Examiner*—Quang T Van
(74) *Attorney, Agent, or Firm*—Knobbe, Martens, Olson & Bear LLP

(57) ABSTRACT

Apparatuses and methods for suppressing thermally induced motion of a workpiece. An apparatus includes a workpiece heating system configured to thermally induce motion of a workpiece, and further includes a damping member spaced apart from the workpiece and configured to apply a damping force to dampen the motion of the workpiece. The damping member may be spaced apart from a rest position of the workpiece by a distance sufficiently small that gas pressure between the damping member and the workpiece opposes the motion of the workpiece. The distance is preferably adjustable.

60 Claims, 10 Drawing Sheets

U.S. PATENT DOCUMENTS

| | | | |
|---|---|---|---|
| 3,240,915 A | 3/1966 | Carter et al. | 392/411 |
| 3,460,510 A | 8/1969 | Currin | 118/720 |
| 3,502,516 A | 3/1970 | Henker | 117/103 |
| 3,610,613 A | 10/1971 | Worden | 269/254 |
| 3,623,712 A | 11/1971 | McNeilly et al. | 263/41 |
| 3,627,590 A | 12/1971 | Mammel | 148/1.5 |
| 3,661,637 A | 5/1972 | Sirtl | 117/201 |
| 3,692,572 A | 9/1972 | Strehlow | 359/586 |
| 3,700,850 A | 10/1972 | Lumley et al. | 219/121 LM |
| 3,836,751 A | 9/1974 | Anderson | 219/411 |
| 3,913,872 A | 10/1975 | Weber | 240/41 |
| 4,027,185 A | 5/1977 | Nodwell et al. | 313/35 |
| 4,041,278 A | 8/1977 | Boah | 219/411 |
| 4,081,313 A | 3/1978 | McNeilly et al. | 156/610 |
| 4,097,226 A | 6/1978 | Erikson et al. | 432/120 |
| 4,101,759 A | 7/1978 | Anthony et al. | 219/343 |
| 4,115,163 A | 9/1978 | Gorina et al. | 148/175 |
| 4,122,240 A | 10/1978 | Banas et al. | 428/655 |
| 4,151,008 A | 4/1979 | Kirkpatrick | 148/1.5 |
| 4,164,643 A | 8/1979 | Peart et al. | 219/411 |
| 4,220,483 A | 9/1980 | Cazcarra | 148/1.5 |
| 4,224,096 A | 9/1980 | Osborne | 156/380 |
| 4,233,493 A | 11/1980 | Nath | 219/354 |
| 4,306,731 A | 12/1981 | Shaw | 279/4 |
| 4,308,078 A | 12/1981 | Cook | 148/1.5 |
| 4,315,130 A | 2/1982 | Inagaki et al. | 219/121 L |
| 4,331,485 A | 5/1982 | Gat | 438/795 |
| 4,356,384 A | 10/1982 | Gat | 219/347 |
| 4,370,175 A | 1/1983 | Levatter | 148/1.5 |
| 4,375,993 A | 3/1983 | Mori et al. | 148/1.5 |
| 4,379,727 A | 4/1983 | Hansen et al. | 148/1.5 |
| 4,398,094 A | 8/1983 | Hiramoto | 250/492.1 |
| 4,421,048 A | 12/1983 | Adema et al. | 114/222 |
| 4,431,459 A | 2/1984 | Teng | 148/1.5 |
| 4,455,479 A | 6/1984 | Itoh et al. | 219/405 |
| 4,482,393 A | 11/1984 | Nishiyama et al. | 438/530 |
| 4,493,977 A | 1/1985 | Arai et al. | 219/411 |
| 4,504,323 A | 3/1985 | Arai et al. | 148/1.5 |
| 4,533,820 A | 8/1985 | Shimizu | 219/411 |
| 4,539,431 A | 9/1985 | Moddel et al. | 136/258 |
| 4,540,876 A | 9/1985 | McGinty | 219/405 |
| 4,550,245 A | 10/1985 | Arai et al. | 219/405 |
| 4,550,684 A | 11/1985 | Mahawili | 118/724 |
| 4,560,420 A | 12/1985 | Lord | 148/1.5 |
| 4,567,352 A | 1/1986 | Mimura et al. | 219/405 |
| 4,581,520 A | 4/1986 | Vu et al. | 219/349 |
| 4,636,969 A | 1/1987 | Kyoden et al. | 364/560 |
| 4,649,241 A | 3/1987 | Young et al. | 200/82 R |
| 4,649,261 A | 3/1987 | Sheets | 219/390 |
| 4,661,177 A | 4/1987 | Powell | 148/189 |
| 4,682,594 A | 7/1987 | Mok | 128/303.1 |
| 4,698,486 A | 10/1987 | Sheets | 250/492.2 |
| 4,700,102 A | 10/1987 | Camm et al. | 313/24 |
| 4,751,193 A | 6/1988 | Myrick | 437/19 |
| 4,755,654 A | 7/1988 | Crowley et al. | 219/405 |
| 4,787,551 A | 11/1988 | Hoyt et al. | 228/179 |
| 4,794,619 A | 12/1988 | Tregay | 374/131 |
| 4,818,327 A | 4/1989 | Davis et al. | 156/345 |
| 4,826,269 A | 5/1989 | Streifer et al. | 350/3.72 |
| 4,851,358 A | 7/1989 | Huber | 437/10 |
| 4,857,689 A | 8/1989 | Lee | 219/10.71 |
| 4,857,704 A | 8/1989 | Jannot et al. | 219/354 |
| 4,891,499 A | 1/1990 | Moslehi | 219/502 |
| 4,933,887 A | 6/1990 | Danko et al. | 364/557 |
| 4,937,490 A | 6/1990 | Camm et al. | 313/12 |
| 4,956,538 A | 9/1990 | Moslehi | 219/121.6 |
| 4,958,061 A | 9/1990 | Wakabayashi et al. | 219/411 |
| 4,959,244 A | 9/1990 | Penney et al. | 427/53.1 |
| 4,979,134 A | 12/1990 | Arima et al. | 364/557 |
| 4,981,815 A | 1/1991 | Kakoschke | 437/173 |
| 4,984,902 A | 1/1991 | Crowley et al. | 374/1 |
| 5,002,630 A | 3/1991 | Kermani et al. | 156/610 |
| 5,011,794 A | 4/1991 | Grim et al. | 437/247 |
| 5,041,714 A | 8/1991 | Funk | 219/121.62 |
| 5,073,698 A | 12/1991 | Stultz | 219/405 |
| 5,155,336 A | 10/1992 | Gronet et al. | 219/411 |
| 5,155,337 A | 10/1992 | Sorrell et al. | 219/411 |
| 5,188,458 A | 2/1993 | Thompson et al. | 374/121 |
| 5,196,353 A | 3/1993 | Sandhu et al. | 437/8 |
| 5,219,786 A | 6/1993 | Noguchi | 437/174 |
| 5,231,595 A | 7/1993 | Makino et al. | 364/557 |
| 5,255,286 A | 10/1993 | Moslehi et al. | 374/121 |
| 5,258,824 A | 11/1993 | Carlson et al. | 356/382 |
| 5,271,084 A | 12/1993 | Vandenabeele et al. | 392/416 |
| 5,275,629 A | 1/1994 | Ajika et al. | 29/25.01 |
| 5,279,973 A | 1/1994 | Suizu | 437/25 |
| 5,282,017 A | 1/1994 | Kasindorf et al. | 356/446 |
| 5,293,216 A | 3/1994 | Moslehi | 356/371 |
| 5,305,417 A | 4/1994 | Najm et al. | 392/418 |
| 5,308,161 A | 5/1994 | Stein | 374/5 |
| 5,310,260 A | 5/1994 | Schietinger et al. | 374/142 |
| 5,313,044 A | 5/1994 | Massoud et al. | 219/121.85 |
| 5,317,429 A | 5/1994 | Mochizuki et al. | 359/42 |
| 5,317,656 A | 5/1994 | Moslehi et al. | 385/12 |
| 5,325,180 A | 6/1994 | Chappelow et al. | 356/401 |
| 5,326,173 A | 7/1994 | Evans et al. | 374/128 |
| 5,336,641 A | 8/1994 | Fair et al. | 437/248 |
| 5,347,128 A | 9/1994 | Puram et al. | 250/330 |
| 5,350,899 A | 9/1994 | Ishikawa et al. | 219/494 |
| 5,359,693 A | 10/1994 | Nenyei et al. | 392/418 |
| 5,364,186 A | 11/1994 | Wang et al. | 374/126 |
| 5,373,135 A | 12/1994 | Beyer et al. | 219/121.67 |
| 5,387,557 A | 2/1995 | Takagi | 437/247 |
| 5,399,506 A | 3/1995 | Tsukamoto | 437/19 |
| 5,399,523 A | 3/1995 | Kakoschke | 437/173 |
| 5,407,485 A | 4/1995 | Takagi | 118/724 |
| 5,418,885 A | 5/1995 | Hauser et al. | 392/416 |
| 5,431,700 A | 7/1995 | Sloan | 29/25.01 |
| 5,436,172 A | 7/1995 | Moslehi | 437/8 |
| 5,436,443 A | 7/1995 | Abtahi | 250/225 |
| 5,442,727 A | 8/1995 | Fiory | 392/416 |
| 5,444,217 A | 8/1995 | Moore et al. | 219/405 |
| 5,445,676 A | 8/1995 | Takagi | 118/719 |
| 5,446,824 A | 8/1995 | Moslehi | 392/416 |
| 5,446,825 A | 8/1995 | Moslehi et al. | 392/416 |
| 5,460,451 A | 10/1995 | Wadman | 374/126 |
| 5,463,534 A | 10/1995 | Raven | 362/32 |
| 5,467,220 A | 11/1995 | Xu | 359/350 |
| 5,487,127 A | 1/1996 | Gronet et al. | 392/416 |
| 5,490,728 A | 2/1996 | Schietinger et al. | 374/7 |
| 5,501,637 A | 3/1996 | Duncan et al. | 374/126 |
| 5,508,934 A | 4/1996 | Moslehi et al. | 364/468 |
| 5,514,885 A | 5/1996 | Myrick | 257/216 |
| 5,517,359 A | 5/1996 | Gelbart | 359/623 |
| 5,530,221 A | 6/1996 | Benda et al. | 219/121.83 |
| 5,539,855 A | 7/1996 | Takahashi et al. | 392/416 |
| 5,561,612 A | 10/1996 | Thakur | 364/557 |
| 5,561,735 A | 10/1996 | Camm | 392/416 |
| 5,580,388 A | 12/1996 | Moore | 118/728 |
| 5,593,608 A | 1/1997 | Suzuki | 219/492 |
| 5,597,237 A | 1/1997 | Stein | 374/9 |
| 5,601,366 A | 2/1997 | Paranjpe | 374/126 |
| 5,603,772 A | 2/1997 | Ide | 118/724 |
| 5,604,592 A | 2/1997 | Kotidis et al. | 356/357 |
| 5,628,564 A | 5/1997 | Nenyei et al. | 374/121 |
| 5,635,093 A | 6/1997 | Arena et al. | 219/466 |
| 5,635,409 A | 6/1997 | Moslehi | 438/7 |
| 5,650,082 A | 7/1997 | Anderson | 219/390 |
| 5,654,904 A | 8/1997 | Thakur | 364/557 |
| 5,677,240 A | 10/1997 | Murakami et al. | 437/195 |
| 5,710,407 A | 1/1998 | Moore et al. | 219/405 |
| 5,715,361 A | 2/1998 | Moslehi | 392/416 |
| 5,727,017 A | 3/1998 | Maurer et al. | 374/9 |
| 5,738,440 A | 4/1998 | O'Neill et al. | 374/9 |

| | | | | | | |
|---|---|---|---|---|---|---|
| 5,790,750 A | 8/1998 | Anderson | 392/416 | 2005/0062388 A1 | 3/2005 | Camm et al. | 313/231.71 |
| 5,802,099 A | 9/1998 | Curran et al. | 374/131 | 2005/0063448 A1 | 3/2005 | Kusuda | 374/1 |
| 5,809,211 A | 9/1998 | Anderson et al. | 392/416 | 2005/0063453 A1 | 3/2005 | Camm et al. | 374/161 |
| 5,814,365 A | 9/1998 | Mahawili | 427/10 | 2005/0179354 A1 | 8/2005 | Camm et al. | 313/231.51 |
| 5,822,172 A | 10/1998 | White | 361/234 | 2006/0096677 A1 | 5/2006 | Camm et al. | 148/565 |
| 5,830,277 A | 11/1998 | Johnsgard et al. | 118/725 | 2007/0069161 A1 | 3/2007 | Camm et al. | 250/504 |
| 5,841,110 A | 11/1998 | Nenyei et al. | 219/497 |
| RE36,050 E | 1/1999 | Thakur et al. | 374/161 |
| 5,858,819 A | 1/1999 | Miyasaka | 438/149 |
| 5,893,952 A | 4/1999 | Aronowitz et al. | 118/725 |
| 5,900,649 A | 5/1999 | Effelsberg | 257/81 |
| 5,908,307 A | 6/1999 | Talwar et al. | 438/199 |
| 5,937,142 A | 8/1999 | Moslehi et al. | 392/416 |
| 5,944,422 A | 8/1999 | Doitel et al. | 374/131 |
| 5,960,158 A | 9/1999 | Gat et al. | 392/416 |
| 5,971,565 A | 10/1999 | Zapata et al. | 362/294 |
| 5,993,059 A | 11/1999 | O'Neill et al. | 374/126 |
| 5,998,768 A | 12/1999 | Hunter et al. | 219/502 |
| 6,016,383 A | 1/2000 | Gronet et al. | 392/416 |
| 6,051,483 A | 4/2000 | Lee et al. | 438/530 |
| 6,066,516 A | 5/2000 | Miyasaka | 438/149 |
| 6,108,490 A | 8/2000 | Lee et al. | 392/416 |
| 6,122,439 A | 9/2000 | Gronet et al. | 392/416 |
| 6,171,641 B1 | 1/2001 | Okamoto et al. | 427/8 |
| 6,187,616 B1 | 2/2001 | Gyoda | 438/160 |
| 6,196,532 B1 | 3/2001 | Otwell | 269/21 |
| 6,222,990 B1 | 4/2001 | Guardado et al. | 392/416 |
| 6,283,630 B1 | 9/2001 | Yazawa | 374/128 |
| 6,293,696 B1 | 9/2001 | Guardado | 374/2 |
| 6,303,411 B1 | 10/2001 | Camm et al. | 438/149 |
| 6,303,917 B1 | 10/2001 | Hawryluk | 250/205 |
| 6,315,878 B1 | 11/2001 | Patadia et al. | 204/298.15 |
| 6,348,099 B1 | 2/2002 | Xia et al. | 118/697 |
| 6,349,270 B1 | 2/2002 | Gurary et al. | 702/134 |
| 6,375,348 B1 | 4/2002 | Hebb et al. | 374/9 |
| 6,376,806 B2 | 4/2002 | Yoo | 219/411 |
| 6,494,371 B1 | 12/2002 | Rekow et al. | 235/454 |
| 6,529,686 B2 | 3/2003 | Ramanan et al. | 392/418 |
| 6,531,681 B1 | 3/2003 | Markle et al. | 219/121.8 |
| 6,534,752 B2 | 3/2003 | Camm et al. | 219/497 |
| 6,536,131 B2 | 3/2003 | Davis | 34/58 |
| 6,561,796 B1 | 5/2003 | Barrerra et al. | 432/5 |
| 6,594,446 B2 * | 7/2003 | Camm et al. | 392/416 |
| 6,608,967 B1 | 8/2003 | Arrison | 392/407 |
| 6,609,909 B2 | 8/2003 | Aoki et al. | 432/258 |
| 6,613,685 B1 | 9/2003 | Granneman et al. | 438/710 |
| 6,621,199 B1 | 9/2003 | Parfeniuk et al. | 313/231.51 |
| 6,634,882 B2 | 10/2003 | Goodman | 432/253 |
| 6,645,356 B1 | 11/2003 | Woodruff et al. | 204/242 |
| 6,669,783 B2 | 12/2003 | Sexton et al. | 118/728 |
| 6,702,302 B2 | 3/2004 | Smedt et al. | 279/106 |
| 6,752,625 B1 | 6/2004 | Aschner et al. | 432/253 |
| 6,849,831 B2 | 2/2005 | Timans et al. | 219/390 |
| 6,855,916 B1 | 2/2005 | Matthews et al. | 219/390 |
| 6,885,815 B2 | 4/2005 | Kusuda et al. | 392/416 |
| 6,897,130 B2 | 5/2005 | Miyauchi et al. | 438/502 |
| 6,938,649 B2 | 9/2005 | Nakazawa | 141/7 |
| 6,941,063 B2 | 9/2005 | Camm et al. | 392/416 |
| 6,953,338 B2 | 10/2005 | Kreiser et al. | 432/259 |
| 6,963,692 B2 | 11/2005 | Camm et al. | 392/416 |
| 6,987,240 B2 | 1/2006 | Jennings et al. | 219/121.8 |
| 6,998,580 B2 | 2/2006 | Kusuda et al. | 219/411 |
| 7,002,363 B2 | 2/2006 | Mathieu | 324/758 |
| 7,005,601 B2 | 2/2006 | Jennings | 219/121.66 |
| 7,070,660 B2 | 7/2006 | Keeton et al. | 118/725 |
| 7,184,657 B1 | 2/2007 | Camm et al. | 392/418 |
| 2001/0047990 A1 | 12/2001 | Yoo | 219/411 |
| 2002/0102098 A1* | 8/2002 | Camm et al. | 392/416 |
| 2003/0081945 A1 | 5/2003 | Kusuda | 392/416 |
| 2003/0196993 A1 | 10/2003 | Jennings | 219/121.8 |
| 2004/0105670 A1 | 6/2004 | Kusuda et al. | 392/418 |
| 2004/0178553 A1 | 9/2004 | Camm et al. | 269/55 |
| 2005/0018196 A1 | 1/2005 | Kusuda | 356/448 |

FOREIGN PATENT DOCUMENTS

| | | |
|---|---|---|
| DE | 42 23 133 C2 | 1/1993 |
| EP | 0 399 662 A2 | 11/1990 |
| EP | 0 538 874 A1 | 4/1993 |
| EP | 0 576 791 A1 | 1/1994 |
| EP | 0 598 409 A1 | 5/1994 |
| EP | 0 840 360 A2 | 5/1998 |
| EP | 0 942 268 A1 | 9/1999 |
| EP | 1 073 096 A1 | 1/2001 |
| GB | 938699 | 10/1963 |
| GB | 2 065 973 A | 7/1981 |
| JP | 55-115327 | 9/1980 |
| JP | 56-048128 | 5/1981 |
| JP | 57-080729 | 5/1982 |
| JP | 57-208146 | 12/1982 |
| JP | 58-070536 | 4/1983 |
| JP | 58-106836 | 6/1983 |
| JP | 59-211221 | 11/1984 |
| JP | 01-246828 | 10/1989 |
| JP | 01-268120 | 10/1989 |
| JP | 02-294027 | 12/1990 |
| JP | 04-355911 | 12/1992 |
| JP | 06-318558 | 11/1994 |
| JP | 07-245274 | 9/1995 |
| JP | 08-107113 | 4/1996 |
| JP | 08-261967 | 10/1996 |
| JP | 10-110977 | 4/1998 |
| JP | 11-097371 | 4/1999 |
| JP | 2004-179510 | 6/2004 |
| JP | 2004-186542 | 7/2004 |
| JP | 2004-247339 | 9/2004 |
| JP | 2005-116812 | 4/2005 |
| NO | 32864 | 8/1921 |
| WO | WO 87/05054 | 8/1987 |
| WO | WO 91/10873 | 7/1991 |
| WO | WO 94/01982 | 1/1994 |
| WO | WO 99/41777 | 8/1999 |
| WO | WO 99/58733 | 11/1999 |
| WO | WO 99/60184 | 11/1999 |
| WO | WO 00/67298 | 11/2000 |
| WO | WO 01/56064 | 8/2001 |
| WO | WO 02/47123 | 6/2002 |
| WO | WO 02/47143 | 6/2002 |
| WO | WO 03/060447 | 7/2003 |
| WO | WO 2004/057650 | 7/2004 |
| WO | WO 2005/029014 | 3/2005 |
| WO | WO 2005/059991 | 6/2005 |
| WO | WO 2005/078762 | 8/2005 |

OTHER PUBLICATIONS

Blake, J., et al., "Slip Free Rapid Thermal Processing", Mat. Res. Soc. Symp. Proc., vol. 92, p. 265-272 (1987).

Bomke, H. A., et al., "Annealing of Ion-Implanted Silicon by an Incoherent Light Pulse," Appl. Phys. Lett., vol. 33, No. 11, pp. 955-957, Dec. 1, 1978.

Burggraaf, P. S., "Rapid Wafer Heating: Status 1983," Semiconductor International, pp. 69-74, Dec. 1983.

Camm, D. M., et al. "2D Real Time Temperature Measurements in a New Short Wavelength Arc Lamp RTP Chamber for Improved Uniformity", Proc. 3rd Int. RTP Conf., RTP'95 p. 241 (Round Rock Texas) (1995).

Camm, D. M. et al., "Engineering Ultra-Shallow Junctions Using IRTP™". 10th IEEE International Conference on Advanced Thermal Processing of Semiconductors—RTP 2002, pp. 5-10 (2002).

Camm, D. M., et al., "High Power Arc Lamp RTP System for High Temperature Annealing Applications", Proc. 2nd Int. RTP Conf., RTP'94, p. 259 (Round Rock Texas) (1994).

Camm, D. M., et al., "Spike Thermal Processing Using Arc Lamps," Advances in Rapid Thermal Processing, (2000).

Celler, G. K., et al., "Drift of Arsenic in SiO2 in a Lamp Furnace with a Built-in Temperature Gradient", Mat. Res. Soc. Symp. Proc., vol. 92, p. 53-58 (1987).

Chen, M. M., et al., "The Use of a Kaleidoscope to Obtain Uniform Flux Over a Large Area in a Solar or Arc Imaging Furnace," Applied Optics, vol. 2, No. 3, pp. 265-271, Mar. 1963.

Cibere, J. J, et al., "Flash Thermal Processing Through the Melting Point of Silicon", 11th IEEE International Conference on Advanced Thermal processing of Semiconductors—RTP 2003 (2003).

Cohen, R. L., et al., "Thermally Assisted Flash Annealing of Silicon and Germanium", Appl. Phys. Lett. vol. 33, No. 8, pp. 751-753, Oct. 1978.

Current, M., et al., "Ion Implantation and Rapid Annealing of 125 mm Wafers," Solid State Technology, pp. 197-202, Oct. 1983.

Dilhac, J-M., et al., "Adaptive Process Control for a Rapid Thermal Processor", SPIE vol. 1393, Rapid Thermal and Related Processing Techniques, p. 395-403 (1990).

Dilhac, J-M., et al, "Thermal Model for Rapid Thermal Processors: Theory and Applications", RTP '93 Conference Proceedings, pp. 12-18 (1993).

Fair, R. B., "Rapid Thermal Processing—A Justification", in Fair, R. B., ed., *Rapid Thermal Processing: Science and Technology* (Boston: Academic Press, Inc., 1993), pp. 1-11.

Fan, J. C. C., et al., "Transient Heating with Graphite Heaters for Semiconductor Processing," in Appleton, B. R. et al., ed., *Laser and Electron-Beam Interactions with Solids: Proceedings of the Materials Research Society Annual Meeting*, Nov. 1981, Boston (New York: North Holland / Elsevier, 1982), pp. 751-758.

Fiory, A. T., et al., "Annealing Ultra-Low Energy Boron Implants with an Arc Lamp System," RTP 1999, pp. 273-280 (1999).

Fiory, A. T., et al., "Electrical Measurements of Annealed Boron Implants for Shallow Junctions," Advances in Rapid Thermal Processing, vol. 99-10, pp. 133-140, (1999).

Fiory, A. T., et al., "Spike Annealing of Implanted PMOS Gates," Proc. of RTP 2000 Conference, pp. 1-8, Sep. 20-22, 2000.

Gat, A., et al. "Introduction to Heatpulse™ Processing Technology," AG Associates, Mountain View, California, pp. 1-29.

Gelpey, J. C., et al., "Advanced Annealing for Sub-130nm Junction Formation", 201st Electrochemical Society Meeting, Symposium QI, Rapid Thermal and Other Short-Time Processing Technologies III, May 12-17, 2002, paper 735 (May 2002).

Gelpey, J. C., et al., "Process Control for a Rapid Optical Annealing System," Mat. Res. Soc. Symp. Press, vol. 52 (1986).

Gelpey, J. C., et al., "Rapid Optical Annealing Using the Water-Wall DC Arc Lamp," Microelectronic Manufacturing and Testing, pp. 22-24, Aug. 1983.

Hill, C., et al., "Rapid Thermal Annealing—Theory and Practice", in Levy, R. A., ed., *Reduced Thermal Processing for ULSI* (New York: Plenum, 1989), pp. 143-180.

Hirscher, H., "Electrostatic Chuck to Boost your Yield", Unaxis Wafer Processing, Chip Online, Issue No. 5, pp. 39-43, undated.

Kakoschke, R., "Is There a Way to a Perfect Rapid Thermal Processing System?", Mat. Res. Soc. Symp. Proc., vol. 224, p. 159-170 (1991).

Kakoschke, R., et al., "Simulation of Temperature Effects During Rapid Thermal Processing", Mat. Res. Soc. Symp. Proc., vol. 146, p. 473-482 (1989).

Kapany, N. S., et al., "Fiber Optics. Part II. Image Transfer on Static and Dynamic Scanning with Fiber Bundles," Journal of the Optical Society of America, vol. 47, No. 5, pp. 423-427, May 1957.

Klabes, R., et al., "Pulsed Incoherent Light Annealing of Arsenic and Phosphorus Implanted Polycrystalline Silicon," Physica Status Solidi, pp. K5-7, K9-12 (1982).

Lefrancois, M. E., et al., "Emissivity Independent Process Control in a Short Wavelength Arc Lamp RTP Chamber", in *MRS Symposium Proceedings*, vol. 429, Rapid Thermal and Integrated Processing V (Pittsburgh, 1996), p. 321.

Lefrancois, M., et al., "Temperature Uniformity During Impulse™ Anneal;" 8th International Conference on Advanced Thermal Processing of Semiconductors, RTP 2000, pp. 1-6, Sep. 20-22, 2000.

Lietoila, A., et al., "Temperature Rise Induced in Si by Continuous Xenon Arc Lamp Radiation," American Institute of Physics, vol. 53, No. 2, pp. 1169-1172, Feb. 1982.

Lischner, D. J., et al., "Rapid Large Area Annealing of Ion-Implanted Si with Incoherent Light," in Appleton, B. R. et al., ed., *Laser and Electron-Beam Interactions with Solids: Proceedings of the Materials Research Society Annual Meeting*, Nov. 1981, Boston (New York: North Holland / Elsevier, 1982), pp. 759-764.

Lojek, B., "Issues in Manufacturing Unique Silicon Devices Using Rapid Thermal Annealing", in Fair, R. B., ed., *Rapid Thermal Processing: Science and Technology* (Boston: D61Academic Press, Inc., 1993), pp. 311-347.

Lord, H. A., "Thermal and Stress Analysis of Semiconductor Wafers in a Rapid Thermal Processing Oven", IEEE Transactions on Semiconductor Manufacturing, vol. 1, No. 3, p. 105-114 (Aug. 1988).

Lue, J. T., "Arc Annealing of BF+2 Implanted Silicon by a Short Pulse Flash Lamp." Appl. Phys. Lett., vol. 36, No. 1, pp. 73-76, Jan. 1, 1980.

Myer, J. H., "Zoomable Kaleidoscopic Mirror Tunnel," Applied Optics, vol. 10, No. 9, pp. 2179-2182, Sep. 1971.

Nishiyama, K., et al., "Radiation Annealing of Boron-Implanted Silicon with a Halogen Lamp," Japanese Journal of Applied Physics, vol. 19, No. 10, pp. L563-L566, Oct. 1980.

Nulman, J., et al., "Pyrometric Emissivity Measurements and Compensation in an RTP Chamber", Mat. Res. Soc. Symp. Proc., vol. 146, p. 461-466 (1989).

Potter, R. J., "Transmission Properties of Optical Fibers," Journal of the Optical Society of America, vol. 51, No. 10, pp. 1079-1089, Oct. 1961.

Powell, R. A., et al., "Activation of Arsenic-Implanted Silicon Using an Incoherent Light Source," Appl. Phys. Lett., vol. 39, No. 2, pp. 150-152, Jul. 15, 1981.

Powell, R. A., et al., "Annealing of Implantation Damage in Integrated-Circuit Devices Using an Incoherent Light Source," J. Vac. Sci. Technol., vol. 20, No. 1, pp. 32-36, Jan. 1982.

Riccardi, A., et al., "The Adaptive Secondary Mirror for the 6.5m Conversion of the Multiple Mirror Telescope", Beyond Conventional Adaptive Optics, Venice, 2001.

Roozeboom, F., "Manufacturing Equipment Issues in Rapid Thermal Processing", in Fair, R. B., ed., *Rapid Thermal Processing: Science and Technology* (Boston: Academic Press, Inc., 1993), pp. 349-423.

Ross, J., et al., "Characterizing Implant Behavior During Flash RTP by Means of Backside Diagnostics", 10th IEEE International Conference on Advanced Thermal Processing of Semiconductors—RTP 2002, pp. 99-105 (2002).

Sedgwick, T.O., "Short Time Annealing," J. Electrochem. Soc., vol. 130, No. 2, pp. 484-492, Feb. 1983.

Semco Engineering, "Smart Solutions for . . . Single Wafer Clamping", as available from http://www.semcoeng.com/Pilot01/Rubrique/Index.php3?IdTheme=6&IdPage=24 on Jul. 11, 2006 (undated).

Semiconductor Industry Association, "International Technology Roadmap for Semiconductors," International Sematech, Austin Texas, pp. 7, 14, 123-131, (1999).

Service Support Specialties, "Hot Plates", as available from http://www.s-cubed.com/pdf/StandAloneHP.pdf on Jul. 11, 2006.

Sheets, R. E., "Automatic Cassette to Cassette Radiant Impulse Processor," Nuclear Instruments and Methods in Physics Research, Amsterdam, North Holland / Elsevier Science Publishers B. V., pp. 219-223 (1985).

Stuart, G. C., et al., "Temperature Diagnostics for a Dual-Arc FRTP Tool", 10th IEEE International Conference on Advanced Thermal Processing of Semiconductors—RTP 2002—pp. 77-82 (2002).

Sumitomo Osaka Cement Co., Ltd., Advanced Materials Research Division, "Characterisitics of fine Al2-O3-SiC Composite ESC", Technical Report, 1999.

Tamarack Scientific Company, "Transient Calorimeter Calibration System," Technical Report AFFDL-TR-75-24, Orange, California, pp. 1-50, Mar. 1975.

Tichy, R. S., et al., "Annealing of Ultra-Shallow Implanted Junctions Using Arc-Lamp Technology: Achieving the 90 nm Node", 9th IEEE International Conference on Advanced Thermal Processing of Semiconductors—RTP 2001 (Sep. 2001).

Tillmann, A., et al., "Processing of 200 and 300 mm Wafers in an Advanced Rapid Thermal Processing System", Proc. RTP 1998. 6th International Conference on Advanced Thermal Processing of Semiconductors, Kyoto, Japan, 1998, pp. 62-63 (1998).

Vandenabeele, P., et al., "Impact of Patterned Layers on Temperature Non-Uniformity During Rapid Thermal Processing for VLSI-Applications", Mat. Res. Soc. Symp. Proc., vol. 146, p. 149-160 (1989).

Varian, Extrion Division Semiconductor Equipment Group, "RTP-800 Rapid Thermal Processor," pp. 1-6, Dec. 1985.

von Gutfeld, R. J., "Crystallization of Silicon for Solar Cell Applications," IBM Technical Disclosure, vol. 19, IBM Corp., pp. 3955-3956, Mar. 1977.

Williamson, D. E., "Cone Channel Condenser Optics," Journal of the Optical Society of America, vol. 42, No. 10, pp. 712-715, Oct. 1952.

Wilson, S. R. et al., "An Overview and Comparison of Rapid Thermal Processing Equipment: A User's Viewpoint", Mat. Res. Soc. Symp. Proc., vol. 52, p. 181-190 (1986).

Habermehl, S. et al., "Properties of Residual Stress Silicon Oxynitrides Used as a Sacrificial Layer", VLSI Conference, Jan. 4-8, 2000.

* cited by examiner

APPARATUSES AND METHODS FOR SUPPRESSING THERMALLY-INDUCED MOTION OF A WORKPIECE

CROSS-REFERENCE TO RELATED APPLICATIONS

This application claims the benefit of priority from U.S. patent application Ser. No. 60/568,685 filed May 7, 2004, and is a continuation-in-part of U.S. patent application Ser. No. 10/742,575 filed Dec. 19, 2003, both of which are hereby incorporated herein by reference.

BACKGROUND OF THE INVENTION

1. Field of Invention

The present application relates to methods and apparatuses for suppressing thermally induced motion of a workpiece.

2. Description of Related Art

Numerous applications involve thermally induced motion of a workpiece. For example, in the manufacture of semiconductor chips such as microprocessors, the workpiece typically includes a semiconductor wafer, supported in a thermal processing chamber for annealing or other heat-treating purposes. U.S. patent application Ser. No. 10/742,575 (publication no. US 2004/0178553 A1), discusses examples of heat-treating techniques for annealing such semiconductor wafers, in which the wafer is first pre-heated to an intermediate temperature, following which the top or device side surface is rapidly heated to an annealing temperature. The initial pre-heating stage occurs at a rate significantly slower than a thermal conduction time through the wafer, and may be achieved by irradiating the back-side or substrate side of the wafer with an arc lamp, to heat the wafer at a ramp rate less than 400° C. per second, for example. The subsequent surface heating stage occurs much more rapidly than the thermal conduction time through the wafer, so that only the device side surface is heated to the final annealing temperature, while the bulk of the wafer remains close to the intermediate temperature. Such surface heating may be achieved by exposing the device-side surface to a high-power irradiance flash from a flash-lamp or bank of flash lamps, the flash having a relatively short duration, such as one millisecond, for example. The cooler bulk of the wafer then acts as a heat sink to facilitate rapid cooling of the device side surface.

Such annealing methods, which involve rapidly heating the device side of the wafer to a substantially higher temperature than the bulk of the wafer, cause the device side to thermally expand at a greater rate than the rest of the wafer. The present inventors and the inventors of the above-noted U.S. applications have appreciated that, depending on the magnitude of the temperature difference between the device side temperature and the temperature of the bulk of the wafer, this may tend to cause "thermal bowing", whereby the normally-planar wafer deforms itself into a thermally deformed shape. Depending on the magnitude and rapidity of the device side heating stage, the thermally deformed shape may have attributes of a dome shape, with the center of the wafer tending to rapidly rise relative to its edge regions. The thermal bowing may also cause the outer perimeter or edge of the workpiece (such as the outer one or two centimeters of a 30-cm wafer, for example) to curl downward steeply, and thus, the thermally deformed shape may also have attributes of a FRISBEE(™) flying disc. In practice, for some applications it has been found that the latter curling effect at the outer perimeter of the workpiece tends to be more pronounced than the former dome-shaped curvature of the workpiece as a whole, although this may depend on the physical parameters of the thermal cycle in question. The thermally deformed shape represents a minimum stress configuration of the wafer, minimizing the thermal stress resulting from the temperature gradient between the device side and the bulk of the wafer. However, due to the extreme rapidity at which the device side of the wafer is heated (in the course of a 1-millisecond flash, for example, much faster than a typical thermal conduction time in the wafer), the deformation of the wafer may occur sufficiently rapidly that the edges of the wafer apply a large downward force onto the support pins that support the wafer in the chamber. As conventional support pins are typically rigid, the resulting reaction force between the pins and the edges of the wafer may damage the wafer. Such forces may also cause the wafer to launch itself vertically upward from the support pins, which may result in further damage to the wafer as the wafer falls back down and strikes the pins. Also, as conventional support pins are not designed to withstand such forces, they tend to break, with the result that the wafer falls in the chamber and is damaged or destroyed. In addition, due to the rapidity at which such thermal bowing occurs, the initial velocities imparted to the various regions of the wafer tend to cause the wafer to overshoot the equilibrium minimum stress shape and oscillate or vibrate, resulting in additional stress and potential damage to the wafer.

The above-noted U.S. application publication No. US 2004/0178553 A1 discloses numerous approaches to overcoming such difficulties, by supporting the workpiece in a manner which allows the workpiece to move under the influence of the resulting thermal stresses in order to minimize its own internal stress, thereby reducing the likelihood of wafer damage or breakage. Approaches to suppressing vibration or oscillation of the wafer are also disclosed, however, further suppression would be desirable, as such vibrations may tend to damage or break the wafer, depending on the surrounding circumstances of the particular annealing method in question.

A recently-proposed variant of the previously-mentioned annealing method involves substituting a hot plate for the arc lamp during the pre-heating stage. The subsequent device-side surface heating stage employs a bank of flash-lamps to produce a high-power irradiance flash. The wafer is held in tight contact with the hot plate by a vacuum chuck, which includes gas channels or passageways defined through the hot plate, and a compressor to pump gas out of the passageways, to create a vacuum in the passageways, immediately beneath the back-side of the wafer. The vacuum in the channels effectively sucks the wafer tightly against the hot plate surface, during both the pre-heating and subsequent device-side surface heating stage. However, the vacuum chuck prevents the wafer from thermally bowing during the device-side surface heating stage, thereby preventing the wafer from deforming itself in order to minimize its own internal stress. As a result, the wafer tends to break, particularly if the magnitude of the "jump" (i.e., the difference between the intermediate temperature and the ultimate device-side temperature) is large. Thus, such constrictive approaches to suppressing motion or vibration of the wafer are undesirable.

Accordingly, there is a need for an improved way of suppressing thermally induced motion of a workpiece.

SUMMARY OF THE INVENTION

The present invention addresses the above need by providing, in accordance with one aspect of the invention, an apparatus for suppressing thermally induced motion of a workpiece. The apparatus includes a workpiece heating system configured to thermally induce motion of the workpiece. The apparatus further includes a damping member spaced apart from the *workpiece and configured to apply a damping force to dampen the motion of the workpiece.

Advantageously, as the damping member is spaced apart from the workpiece, direct mechanical contact between the damping member and the workpiece can be avoided, thereby reducing the likelihood of breakage or damage to the workpiece.

The damping member is preferably spaced apart from a rest position of the workpiece by a distance sufficiently small that gas pressure between the damping member and the workpiece opposes the motion of the workpiece. For example, if the workpiece is a semiconductor wafer supported a small distance above the damping member, the irradiance flash may cause the central region of the wafer to rapidly rise upward away from the damping member. This creates a low gas pressure zone in the gap between the wafer and the damping member. Thus, a pressure differential is created, between the higher ambient pressure above the wafer, and the lowered pressure in the gap beneath the wafer, which tends to oppose the upward motion of the wafer. Conversely, if the central region of the wafer comes back downward and overshoots its planar equilibrium position, this creates a higher pressure in the gap between the wafer and the damping member than the ambient pressure above the wafer, so that the pressure differential continuously opposes the motion of the wafer as it oscillates or vibrates. Thus, motion and vibration of the wafer are dampened, without the necessity of potentially damaging physical contact between the wafer and the damping member.

The workpiece may include a semiconductor wafer and the damping member may include a damping plate spaced apart from the wafer. For example, the damping plate may be spaced apart from the rest position of the wafer by a distance on the order of one millimeter. More particularly, the damping plate may be spaced apart from the rest position of the wafer by a distance greater than one-half millimeter, and/or less than three millimeters. For example, in a particular embodiment involving wafer processing at atmospheric pressure, the damping plate may be spaced apart from the rest position of the wafer by a distance between one-half millimeter and three millimeters.

The apparatus may further include a support system configured to support the wafer above the damping plate. Alternatively, the apparatus may include a support system configured to support the wafer below the damping plate.

Or, as a further alternative, the damping member may include first and second damping members, and the apparatus may further include a support system configured to support the workpiece above the first damping member and below the second damping member.

The damping plate may include an annular recess defined in a surface thereof. The annular recess may be configured to accommodate the outer edge of the wafer therein during the thermally induced curling. Such a recess may be particularly advantageous in embodiments in which the workpiece is a semiconductor wafer and the thermally induced motion includes thermally induced curling of an outer edge of the wafer. Such recesses may also be advantageous in other embodiments, depending on the manner in which the workpiece is supported.

The workpiece heating system may include a pre-heating system configured to pre-heat the workpiece to an intermediate temperature, and a surface heating system configured to heat only a surface region of the workpiece to a desired temperature greater than the intermediate temperature. If so, each of the pre-heating system and the surface heating system may include a respective irradiance system. For example, the pre-heating system may include a DC arc lamp, and the surface heating system may include at least one irradiance flash device configured to expose the workpiece to an irradiance flash. The irradiance flash device may include a flash lamp or a microwave pulse generator, for example. The damping member may be interposed between the at least irradiance flash device and the workpiece and may be transparent to at least some wavelengths of the irradiance flash.

The damping member may include a window. The window may include a quartz window, for example.

The apparatus may further include a temperature control system configured to control a temperature of the window.

The apparatus may further include a supplemental heater configured to supply supplemental heat energy to the damping member in the vicinity of an outer perimeter region of the workpiece. The supplemental heater may include an electrical resistance heater disposed in the vicinity of the outer perimeter region of the workpiece. Alternatively, the supplemental heater may include material in the vicinity of the outer perimeter of the workpiece having a greater emissivity than material of the damping member in the vicinity of a center of the workpiece.

The irradiance system may further include a pre-heating system configured to pre-heat the workpiece during a pre-heating stage preceding the irradiance flash.

The distance between the damping member and the workpiece may be adjustable to adjust the damping force. For example, the distance between the damping member and the workpiece may be adjustable between a first distance employable during the pre-heating stage, and a second distance smaller than the first distance employable during the irradiance flash and a motion-damping stage thereafter. The first distance may be at least two millimeters. As a further example, the first distance may be on the order of one centimeter. Advantageously, as the first distance used during the pre-heating stage is larger than the second distance used during the irradiance flash and the subsequent motion-damping stage, thermal coupling effects are reduced during the pre-heating stage. The second distance may be sufficiently small that gas pressure between the damping member and the workpiece opposes the motion of the workpiece during the irradiance flash and the motion-damping stage. For example, the second distance may be about one millimeter. As a further example, the second distance may be about one-half millimeter. In addition to the first and second distances, the distance may be further adjustable to a third distance greater than the second distance, employable during a subsequent cooling stage following the motion-damping stage. Advantageously, as the third distance used for the cooling stage is larger than the second distance used for the irradiance flash and the motion-damping stage, thermal coupling effects are also reduced during the cooling stage. For example, the third distance may be at least two millimeters. Advantageously, therefore, as discussed herein, such adjustability reduces thermal coupling effects between the workpiece and the damping member during both the pre-heating and subsequent cooling stages, while allowing the damping member to suppress thermally induced motion of the workpiece during the irradiance flash and subsequent motion-damping stage.

The damping member may be configured to apply a spatially-varying damping force. For example, the damping member may include a planar plate having a plurality of recesses defined therein, to cause the damping force to be smaller in the vicinity of each recess than away from the recesses.

The damping member may include an electrostatic chuck configured to apply an electrostatic force to the workpiece in response to the motion of the workpiece. The apparatus may further include a detector configured to detect the motion of the workpiece.

The electrostatic chuck may include a plurality of variable electrostatic force generators. Each of the generators may be selectively controllable to electrostatically deform the workpiece to a desired shape prior to the thermally induced motion of the workpiece.

In accordance with another aspect of the invention, there is provided an apparatus including means for thermally inducing motion of the workpiece, and means for applying a damping force to dampen the motion of the workpiece, the means for applying being spaced apart from the workpiece.

In accordance with another aspect of the invention, there is provided a method including thermally inducing motion of the workpiece, and applying a damping force to dampen the motion of the workpiece with a damping member spaced apart from the workpiece.

Applying a damping force may include maintaining a distance between the damping member and the workpiece sufficiently small that gas pressure between the damping member and the workpiece opposes the motion of the workpiece.

The workpiece may include a semiconductor wafer and the damping member may include a damping plate spaced apart from the wafer.

Maintaining may include maintaining the damping plate at a distance on the order of one millimeter from a rest position of the wafer. This may include maintaining the damping plate at a distance greater than one-half millimeter from the rest position of the wafer, or may include maintaining the damping plate at a distance less than three millimeters from the rest position of the wafer, for example. Thus, this may include maintaining the damping plate at a distance between one-half millimeter and three millimeters from the rest position of the wafer.

Maintaining may include supporting the wafer above the damping plate, or may include supporting the wafer below the damping plate.

The damping member may include first and second damping members, in which case maintaining may include supporting the workpiece above the first damping member and below the second damping member.

The method may further include accommodating the outer edge of the wafer in an annular recess defined in a surface of the damping plate during the thermally induced motion.

Thermally inducing the motion may include irradiating the workpiece. This may include exposing the workpiece to an irradiance flash, which may be produced by a flash lamp or a microwave pulse generator, for example. The damping member may be transparent to at least some wavelengths of the irradiance flash, and irradiating may include transmitting at least some of the irradiance flash through the damping member to the workpiece.

The damping member may include a window such as a quartz window, and the method may further include controlling a temperature of the window.

The method may further include supplying supplemental heat energy to the damping member in the vicinity of an outer perimeter region of the workpiece.

This may include supplying electric current to an electrical resistance heater disposed in the vicinity of the outer perimeter region of the workpiece. Alternatively, this may include irradiating material in the vicinity of an outer perimeter of the workpiece having a greater emissivity than material of the damping member in the vicinity of a center of the workpiece.

The method may further include pre-heating the workpiece during a pre-heating stage preceding the irradiance flash.

The method may include adjusting the distance between the damping member and the workpiece. This may include maintaining a first distance between the damping member and the workpiece during the pre-heating stage, and maintaining a second distance smaller than the first distance between the damping member and the workpiece during the irradiance flash and a motion-damping stage thereafter. Maintaining the first distance may include maintaining a distance of at least two millimeters between the damping member and the workpiece during the pre-heating stage. Maintaining the second distance may include maintaining a distance sufficiently small that gas pressure between the damping member and the workpiece opposes the motion of the workpiece during the irradiance flash and the motion-damping stage. This may include maintaining a distance of about one millimeter between the damping member and the workpiece during the irradiance flash and the motion-damping stage. Alternatively, this may include maintaining a distance of about one-half millimeter between the damping member and the workpiece during the irradiance flash and the motion-damping stage. The method may further include maintaining a third distance greater than the second distance between the damping member and the workpiece during a subsequent cooling stage following the motion-damping stage. Maintaining the third distance may include maintaining a distance of at least two millimeters between the damping member and the workpiece during the cooling stage. Advantageously, as the first and third distances are greater than the second distance, thermal coupling effects are reduced during the pre-heating and cooling stages, while allowing for adequate motion damping during the irradiance flash and the motion-damping stage.

Applying a damping force may include applying a spatially-varying damping force. For example, the damping member may include a planar plate having a plurality of recesses defined therein, such that the damping force resulting from gas pressure change is smaller in the vicinity of each recess than the damping force away from the recesses.

Applying a damping force may include varying a force applied by an electrostatic chuck in response to the motion of the workpiece. The method may further include detecting the motion of the workpiece. The electrostatic chuck may include a plurality of variable electrostatic force generators, and may further include selectively controlling the electrostatic force generators to electrostatically deform the workpiece to a desired shape prior to the thermally induced motion of the workpiece.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
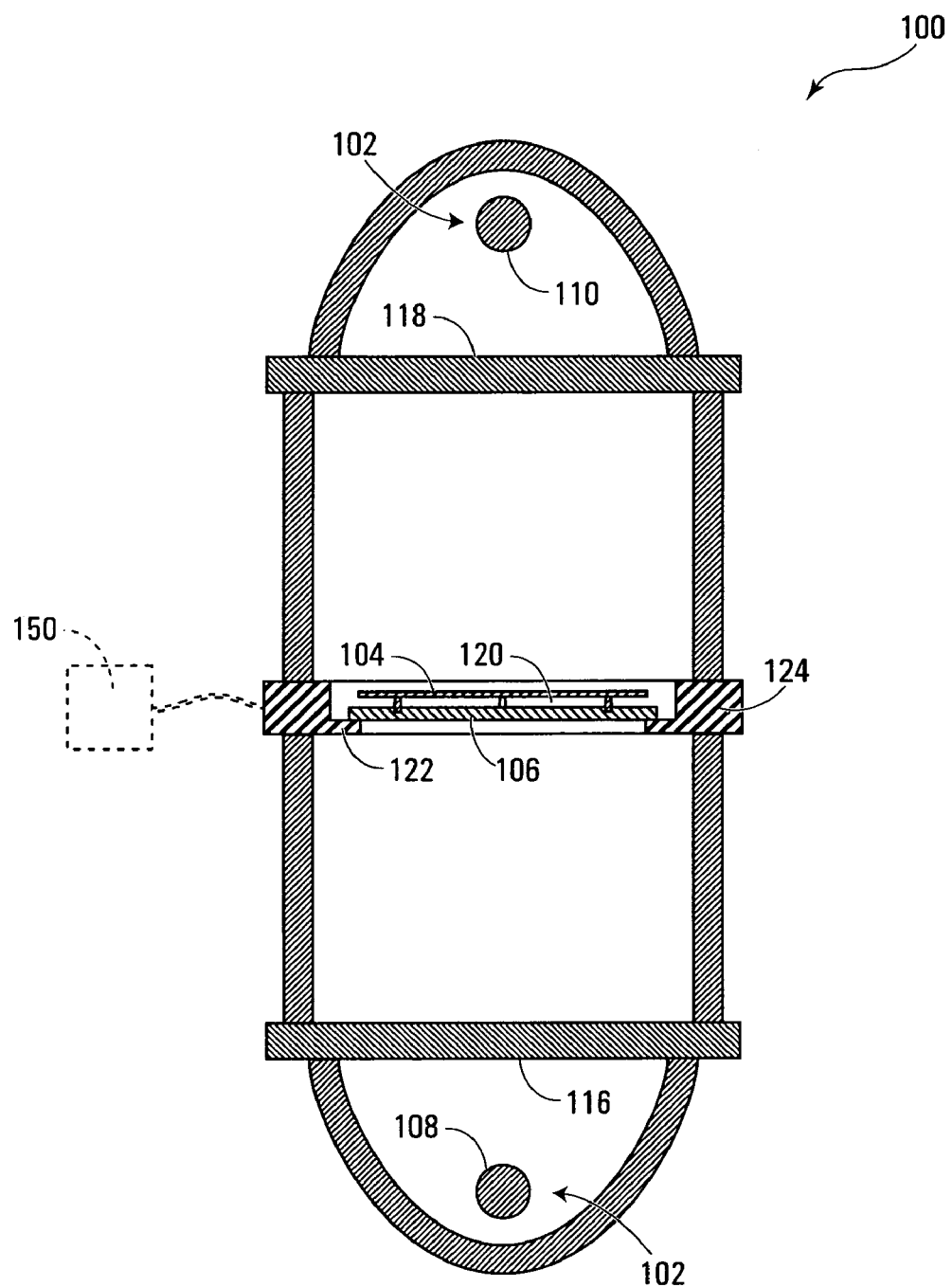
FIG. 1 is a cross-section of an apparatus for suppressing thermally induced motion of a workpiece, according to a first embodiment of the invention.
Figure 2:
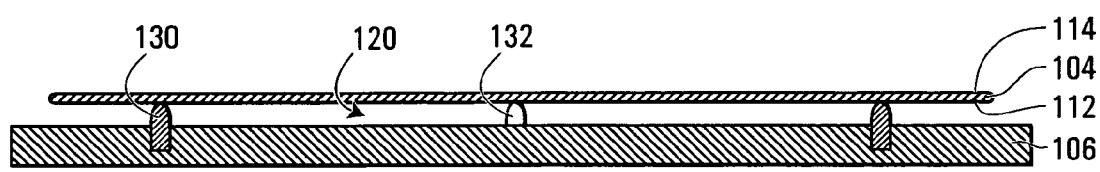
FIG. 2 is a cross-section of a damping member and a workpiece shown in FIG. 1.

Referring to FIGS. 1 and 2, an apparatus for suppressing thermally induced motion of a workpiece according to a first embodiment of the invention is shown generally at 100. In this embodiment, the apparatus 100 includes a workpiece heating system shown generally at 102, configured to thermally induce motion of the workpiece 104, which in this embodiment is achieved by heat-treating the workpiece in a manner that thermally induces such motion. In the present embodiment, the apparatus 100 further includes a damping member 106, spaced apart from the workpiece 104 and configured to apply a damping force to dampen the motion of the workpiece.

In this embodiment, the heating system 102 includes a pre-heating system configured to pre-heat the workpiece to an intermediate temperature, and a surface heating system configured to heat only a surface region of the workpiece to a desired temperature greater than the intermediate temperature. In this embodiment, each of the pre-heating system and the surface heating system includes a respective irradiance system. More particularly, in this embodiment the pre-heating system includes a DC arc lamp 108, and the surface heating system includes at least one irradiance flash device configured to expose the workpiece 104 to an irradiance flash. More particularly still, in this embodiment the irradiance flash device includes a flash lamp 110, configured to produce an irradiance flash consisting primarily of visible and infrared wavelengths. Alternatively, the irradiance flash device may include a microwave pulse generator configured to produce an irradiance flash consisting primarily of microwave wavelengths. More generally, other suitable pre-heating systems and surface heating systems may be substituted.

In this embodiment the workpiece 104 includes a semiconductor wafer, and the damping member 106 includes a damping plate spaced apart from the wafer. In this embodiment, the damping member 106 is interposed between the arc lamp 108 and the workpiece 104. In this embodiment, the damping member includes a window. More particularly, in this embodiment the damping member includes a quartz window. More particularly still, in this embodiment the damping member includes ultra-pure, high quality, non-solarizing quartz, although alternatively, other suitable materials may be substituted. In this embodiment, the damping member 106 is transparent to most wavelengths produced by either the arc lamp 108 or the flash lamp 110.

In the present embodiment, the arc lamp 108 and the flash lamp 110 include high-intensity arc lamps manufactured by Mattson Technology Canada Inc. of Vancouver, Canada, such as those described in U.S. Pat. No. 6,621,199, or in U.S. patent application Ser. No. 10/777,995 filed Feb. 12, 2004, for example. In this embodiment the arc lamp 108 is used to pre-heat the workpiece 104 to an intermediate temperature, by irradiating a back-side or substrate side 112 of the workpiece, at a rate slower than a thermal conduction time through the workpiece. In this embodiment, the arc lamp 108 pre-heats the workpiece at a rate between about 100° C. per second and about 400° C. per second, to a desired intermediate temperature in the range of between about 600° C. and 1250° C., although these are merely illustrative examples; alternatively, other pre-heating rates and intermediate temperatures may be substituted.

When the workpiece 104 reaches the intermediate temperature, the arc lamp 108 is deactivated and the flash lamp 110 is used to produce a high intensity irradiance flash incident upon a device side 114 of the workpiece 104. The duration of the irradiance flash is much shorter than a thermal conduction time through the workpiece 104 (the latter thermal conduction time is typically on the order of 10-15 ms). Thus, the irradiance flash heats the device side 114 to a substantially higher annealing temperature, at a rate much faster than the thermal conduction time through the workpiece, so that only the device-side surface region of the workpiece 104 is heated to the final annealing temperature, while the bulk of the workpiece remains close to the relatively cooler intermediate temperature. The final annealing temperature may include a higher temperature in the range of 1050° C. to a temperature close to the melting point of silicon, such as 1410° C., for example. To achieve this, in the present embodiment the irradiance system, or more particularly the flash-lamp 110, is operable to irradiate the device side 114 with a high-power flash having a relatively short duration, preferably on the order of about one millisecond or less, for example, to heat the device side 114 at a heating rate in excess of $10^5$° C./sec. In this embodiment, it is assumed that the high intensity and short duration of the irradiance flash tend to cause rapid thermal bowing of the workpiece 104, with a central region of the device side 114 moving rapidly upward and the outer edges of the workpiece 104 tending to move downward, resulting in a slightly domed shape of the workpiece and steeply curled outer edges thereof, due to the greater thermal expansion of the device side 114 than the remainder or bulk of the workpiece. It is further assumed that such thermal bowing will occur sufficiently rapidly that as the workpiece returns from its initial thermally deformed shape to its planar equilibrium position, it will tend to overshoot the equilibrium position, and begin to oscillate thereabout.

As noted above, in this embodiment the damping member 106 includes a damping plate spaced apart from the workpiece 104. More particularly, in this embodiment the damping plate is spaced apart from a rest position of the workpiece by a distance sufficiently small that gas pressure between the damping member 106 and the workpiece 104 opposes the motion of the workpiece.

In this regard, the spacing between the damping member and the workpiece will generally depend upon the desired amount of damping force. In this embodiment, when the workpiece 104 is exposed to a rapid high-intensity irradiance flash and initially thermally bows as described above, with a central region of the device side 114 rising rapidly upwards as the workpiece assumes an initial domed shape with downwardly curled outer edges, a low gas pressure zone results in a gap 120 between the backside 112 of the workpiece 104 and the damping member 106, substantially lower than the ambient gas pressure above the device side 114 of the workpiece. This pressure differential tends to apply a downward damping force on the central region of the workpiece, in opposition to the direction of its motion. When the workpiece subsequently returns to and overshoots its initial relatively planar configuration (i.e. when the central region bows downward toward the damping member), the pressure in the gap 120 will increase to a greater pressure than the ambient gas pressure above the device side 114, resulting in a pressure differential which tends to apply an upward damping force on the central region of the workpiece, again in opposition to the direction of its motion. If the workpiece continues to oscillate about its planar initial position, the pressure differential continues to produce a damping force in opposition to the motion of the workpiece. The magnitude of this pressure differential (and hence of the resulting damping force) is dependent upon the size of the gap 120 between the workpiece and the damping member. A smaller gap tends to produce a greater percentage pressure change in the gap, thereby producing a greater restoring or damping force. However, if the gap becomes too small, the damping force may be too large, and the resulting stress may damage or break the workpiece. Conversely, if the gap is too large, the damping force may be too small to adequately dampen the motion of the workpiece. Balancing these considerations, in the present embodiment the damping plate 106 is spaced apart from the rest position of the workpiece by a distance on the order of one millimeter. More particularly, in this embodiment the gap 120 is greater than one-half millimeter, and less than three millimeters, as it has been found that a spacing range of between one-half millimeter and three millimeters tends to provide an optimum damping force in the present embodiment. Alternatively, other suitable gaps may be substituted, and will depend on the configuration of the particular apparatus and desired damping force in question.

In this embodiment, the apparatus 100 further includes a first window 116 interposed between the arc lamp 108 and the back-side 112 of the workpiece 104, and a second window 118 interposed between the flash lamp 110 and the device side 114 of the workpiece. In this embodiment, the windows 116 and 118, like the damping member 106, are transparent to the wavelengths at which most of the radiant energy from the arc lamp 108 and the flash lamp 110 is produced. More particularly, in this embodiment the windows 116 and 118 include respective water-cooled quartz windows, similar to those disclosed in U.S. patent application publication no. US 2002/0102098. In this embodiment, the damping member 106 is not cooled or otherwise temperature-controlled, however, if desired, a suitable temperature control system 150 may be provided. For example, the temperature control system may include a cooling system configured to circulate an appropriate cooling fluid (gas or liquid) through the damping member 106. If desired, for economic efficiency, a common coolant fluid system may be used for both the damping member 106 and the windows 116 and 118; however, the desirability of such a system may depend on the choice of measurement or diagnostic wavelengths employed in a given embodiment. For example, in one embodiment, thermal emissions from the workpiece 104 may be measured at a diagnostic wavelength greater than 1.4 μm, such as 1450 nm for example, and the windows 116 and 118 may be water-cooled. In such an embodiment, the water coolant absorbs substantially all radiation from the arc lamp and from the flash lamp at the diagnostic wavelength of 1450 nm, and thus prevents the measurements of the thermal emissions from the workpiece from being influenced by the radiation emitted by the arc lamp or the flash lamp. Therefore, in such an embodiment, if the damping member is interposed between the workpiece and the measuring device, it would be undesirable for the damping member 106 to also be water-cooled, as the water coolant would absorb the radiation thermally emitted by the workpiece at the 1450 nm diagnostic wavelength before it could be detected or measured. Thus, suitable coolants other than water may be substituted, if desired. Alternatively, rather than or in addition to a cooling system, the temperature control system 150 may be configured to maintain a desired elevated temperature or range of temperatures of the damping member 106.

Still referring to FIGS. 1 and 2, in this embodiment, the apparatus 100 further includes a support system configured to support the workpiece above the damping plate 106. More particularly, in this embodiment the support system includes a plurality of support pins, such as those shown at 130 and 132 in FIG. 2, for example. In this embodiment, each of the support pins includes ultra-pure, high quality, non-solarizing quartz, although alternatively, other suitable materials may be substituted. In the present embodiment, each of the support pins is mounted in the damping member 106, and extends a depth of 3 mm into the damping member 106 (which in this embodiment has a thickness of 5 mm). Each of the support pins has a rounded upper tip protruding upwards from the damping member 106, to minimize the likelihood of scratching or damaging the workpiece 104, and also to reduce thermal contact. The height of the support pins above the upper surface of the damping member 106 corresponds to the desired height of the gap 120 between the damping member 106 and the workpiece 104, which in this embodiment is preferably in the range of one-half millimeter to three millimeters.

In this embodiment, the support pins are disposed at a common radial distance from a center of the damping member 106, at a location radially inward from an outer circumferential edge of the workpiece 104. In this regard, in the present embodiment, the locations of the support pins are selected to balance two competing factors, namely, temperature uniformity during pre-heating, and survivability of the workpiece during the irradiance flash. Positioning the pins in the vicinity of an outer exclusion zone of the workpiece, at its outer perimeter, tends to provide improved temperature uniformity during pre-heating, but tends to increase stress on the workpiece during the irradiance flash; conversely, although positioning the support pins somewhat further inward tends to improve workpiece survivability during the flash by reducing stress in the workpiece and minimizing motion of its center of mass, this tends to reduce temperature uniformity during pre-heating. The appropriate positions of the support pins to balance these factors will tend to depend upon the particular thermal cycle in question, including its pre-heating and flash heating rates. In this embodiment, there are four such support pins disposed at 900 intervals around the damping member 106, at the desired radial distance from its center. Alternatively, other numbers of pins, such as eight pins for example, may be substituted. Or, as a further alternative, the workpiece 104 may be supported in its desired rest position relative to the damping member by a support system similar to any of those disclosed in the above-noted U.S. patent application publication no. US 2004/0178553 A1.

In this embodiment, the damping member 106 itself is supported by an annular inwardly-protruding supporting edge 122 of a workpiece plane plate 124 (similar to various plates disclosed in the above-noted U.S. application publication no. US 2004/0178553 A1), which has a hollow cylindrical aperture defined therethrough, in which the damping member 106 and the workpiece 104 are supported.

In operation, it has been found that the presence of the damping member 106, at an optimized spacing from the workpiece 104 as discussed above, tends to reduce the initial amplitude of the thermally induced motion by roughly an order of magnitude, and similarly tends to significantly reduce both the magnitude and duration of subsequent workpiece oscillations or vibrations immediately following the irradiance flash. Thus, the likelihood of damage to or breakage of the workpiece is significantly reduced.

Referring back to FIG. 1, although the damping member 106 has been described as transparent to most wavelengths produced by the irradiance system, alternatively, the damping member 106 may be partly or wholly opaque. For example, if desired, the arc lamp or other pre-heating device may be moved to the upper portion of the apparatus shown in FIG. 1, in the vicinity of the flash lamp 110, or the flash lamp 110 may be used as both the pre-heating device (in continuous DC mode) and as the irradiance flash device (by discharging charged capacitor banks, not shown), so that the workpiece 104 is irradiated only from above. Or, as a further alternative, the damping member 106 itself may include a hot plate and may therefore act as a pre-heating device to pre-heat the workpiece. In such an embodiment, the workpiece may be either sustained at a fixed distance above the hot plate and pre-heated by conduction through the ambient gas in the apparatus 100, or alternatively, may be placed in contact with the hot plate during the pre-heating stage, and may then be elevated to the desired gap distance above the damping member 106 for damping of thermally induced motion during and immediately following the irradiance flash.

Figure 3:
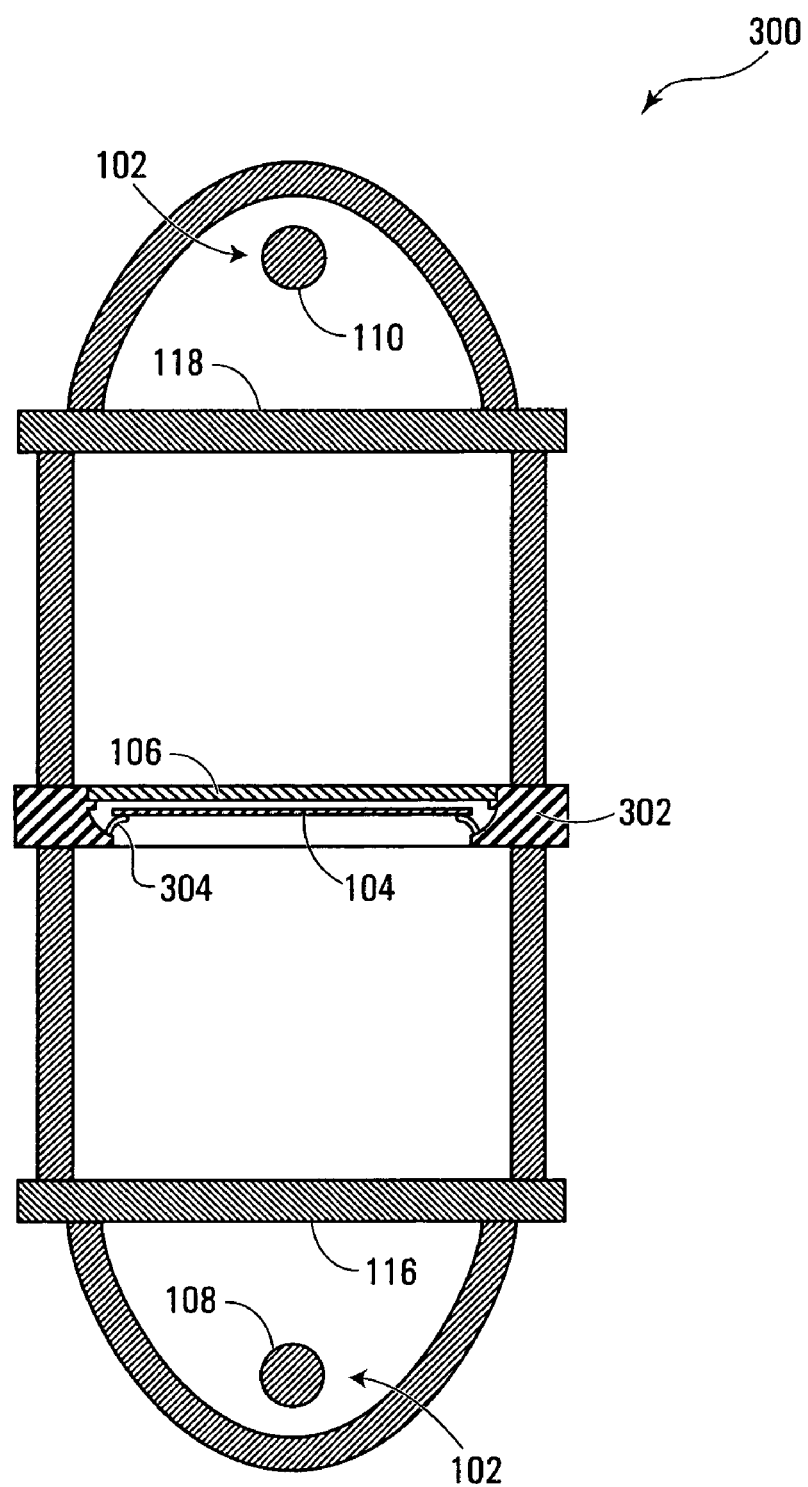
FIG. 3 is a cross-section of an apparatus for suppressing thermally induced motion of a workpiece, according to a second embodiment of the invention.

Referring to FIG. 3, the damping member 106 need not be below the workpiece 104, but may be above the workpiece if desired. For example, an apparatus for suppressing thermally induced motion of a workpiece according to a second embodiment of the invention is shown generally at 300 in FIG. 3. The apparatus 300 includes a modified workpiece plane plate 302, which acts as a support system configured to support the workpiece below the damping member. The workpiece plane plate 302 supports the workpiece 104 using a plurality of flexible quartz fiber supports such as that shown at 304, as disclosed in the above-noted U.S. application publication no. US 2004/0178553 A1. The workpiece plane plate 302 further includes an annular inwardly-protruding supporting edge for supporting the damping member 106 at a desired gap distance above the rest position of the workpiece 104. In this embodiment, as the damping member 106 is thus interposed between the flash lamp 110 and the workpiece 104, it is transparent to the wavelengths at which most of the radiant energy from the flash lamp 110 is produced.

Figure 4:
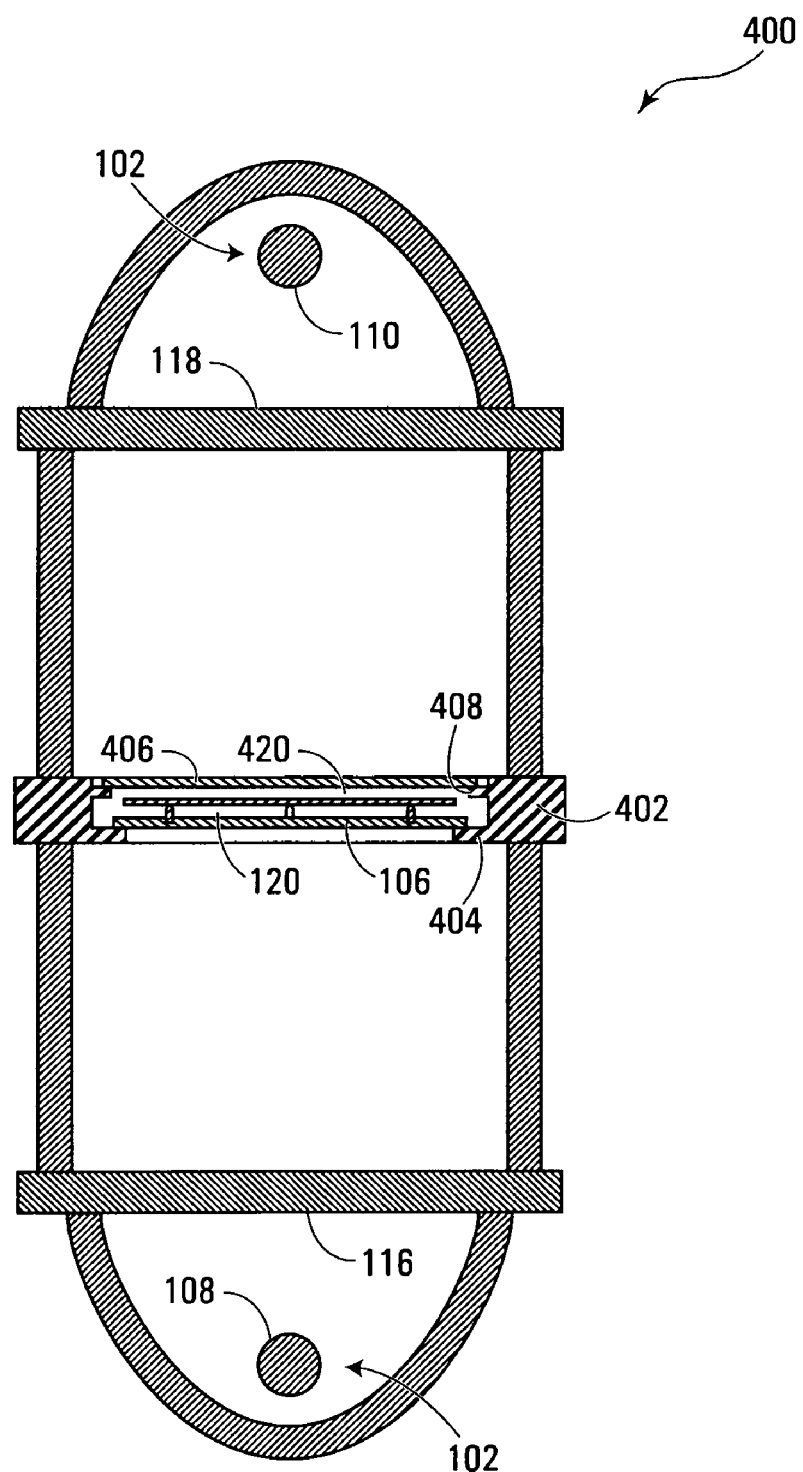
FIG. 4 is a cross-section of an apparatus for suppressing thermally induced motion of a workpiece, according to a third embodiment of the invention.

Referring to FIGS. 1 and 4, an apparatus for suppressing thermally induced motion according to a third embodiment of the invention is shown generally at 400 in FIG. 4. The apparatus 400 includes a workpiece plane plate 402, having a lower annular inwardly-protruding supporting edge 404, for supporting the damping member 106, in a manner similar to the embodiment shown in FIG. 1. However, in this embodiment the apparatus 400 further includes a second damping member 406, supported by an upper annular inwardly-protruding supporting edge 408 of the workpiece plane plate 402. In this embodiment, the support pins protruding upwardly from the first damping member 106 act as a support system configured to support the workpiece above the first damping member and below the second damping member. In this embodiment, the gap 120 between the back-side 112 of the workpiece and the damping member 106 is similar to that of the previous embodiment, i.e., preferably on the order of one-half millimeter to three millimeters. Similarly, in this embodiment a gap 420 between the device side 114 of the workpiece and the second damping member 406 is also of generally the same order of magnitude. In the present embodiment, in which the workpiece is a semiconductor wafer having a device side 114, it is not desirable for the device side 114 to physically contact the second damping member 406, as such contact may damage devices on the device side 114. Thus, if desired, the gap 420 may be greater than the gap 120, or alternatively, both the gaps 120 and 420 may be slightly greater than in the previously-described embodiments, as their combined effect may yield an adequate damping force despite the reduction in the damping force provided by either one in isolation. In addition to providing an enhanced damping force, the presence of both first and second damping members in close proximity to the wafer tends to reduce gas throughput in the vicinity of the wafer, which tends to reduce convection and contamination problems.

Figure 5:
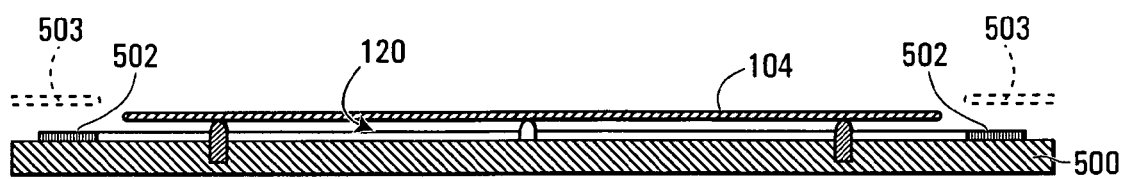
FIG. 5 is a cross-section of a damping member and a workpiece according to a fourth embodiment of the invention.

Referring to FIGS. 1, 2 and 5, a damping member according to a fourth embodiment of the invention is shown generally at 500 in FIG. 5. In this embodiment, the damping member 500 is generally similar to the damping member 106 shown in FIG. 2, and is transparent to most wavelengths produced by the arc lamp 108 and the flash lamp 110. However, in this embodiment the damping member 500 includes a supplemental heater 502 configured to supply supplemental heat energy to the damping member in the vicinity of an outer perimeter region of the workpiece. More particularly, in this embodiment the supplemental heater 502 includes an electrical resistance heater disposed in the vicinity of the outer perimeter region of the workpiece. More particularly still, in this embodiment the electrical resistance heater has an annular shape with a circumference greater than that of the workpiece 104, and is mounted on top of the damping member 500, at a location radially outward from the outer perimeter of the workpiece. In this regard, in the present embodiment, the primary source of heating of the damping member 500 is the workpiece 104 itself, through both thermal radiative emissions from the workpiece, and conduction through ambient gas in the gap 120. Due to geometry, the center of the damping member 500 receives more heating from these effects than the outer perimeter regions of the damping member 500. Therefore, the damping member becomes hotter at its center, and tends to return more heat to the central region of the workpiece 104 than to the outer perimeter regions of the workpiece. In addition, it will be appreciated that due to edge effects, the workpiece tends to irradiate away more energy at its outer perimeter region than at its central region, due to the greater ratio of surface area to volume at the outer perimeter region. To compensate for these effects and thus improve temperature uniformity of the workpiece, electric current is supplied to the supplemental heater 502 by a system controller (not shown), causing the supplemental heater 502 to deliver additional heat energy to the damping member 500 in the vicinity of the outer edge regions of the workpiece. The amount of electric current delivered to the supplemental heater, and hence the amount of heat energy delivered by the supplemental heater to the damping member, is preferably controllable, in order to provide flexibility to achieve improved temperature uniformity in varying thermal cycles. Thus, by supplying supplemental heat energy to the damping member in a controllable manner, the temperature uniformity of the damping member is improved, thereby reducing the tendency of the damping member to return heat to the workpiece in a non-uniform manner.

Alternatively, rather than an electrical resistance heater, the supplemental heater 502 may include material in the vicinity of the outer perimeter of the workpiece, having a greater emissivity than material of the damping member in the vicinity of the center of the workpiece. For example, such material may include a layer of silicon material similar to that of the workpiece 104 itself, mounted in an annular ring on an upper surface of the damping member 500. Such material is thus heated by the irradiance system (including the arc lamp 108 and the flash lamp 110) at a greater rate than surrounding material of the damping member, due to its greater emissivity. In addition to being heated by the irradiance system, such material also absorbs a greater percentage (due to its higher emissivity) of the relatively smaller amounts of thermal emissions from the workpiece than the remainder of the damping member 500. Thus, in such an embodiment, the material of the supplemental heater 502 at the outer region of the damping member tends to remain above the temperature of the central region of the damping member 500, and tends to return a comparable or greater amount of heat energy to the workpiece, thereby compensating for the aforementioned effects and improving the temperature uniformity of the workpiece. The use of such materials as the supplemental heater may be suitable for some applications, although the flexibility resulting from the controllability of electrical resistance heating may be preferred for others.

Although a discontinuity has been shown in FIG. 5 between the supplemental heater 502 and the remainder of the damping member 500, alternatively, if desired, the supplemental heater 502 may be formed within the damping member 500 itself. For example, the supplemental heater 502 may include an electrical resistance heater formed within the damping member itself. Similarly, in embodiments in which the supplemental heater 502 includes material in the vicinity of the outer perimeter of the workpiece having a greater emissivity than material of the damping member in the vicinity of the center of the workpiece, rather than providing such material on an outer surface of the damping member, such material may be provided integrally within the damping member 500 itself. In such embodiments, the emissivity of the material may be spatially varied in either a continuous or discrete manner, by adding appropriate dopants to the material of the damping member 500 (which in this embodiment is quartz), to produce a desired emissivity profile across the entire damping member.

If desired, a blocking member 503 may be provided radially outward from and vertically above the outer perimeter of the workpiece, positioned above the supplemental heater 502. The blocking member 503 may include reflective surfaces, in order to protect the supplemental heater 502 from the irradiance flash produced by the flash lamp 110, and also to reflect additional thermal emissions from the edge regions of the workpiece back to the workpiece.

Figure 6:
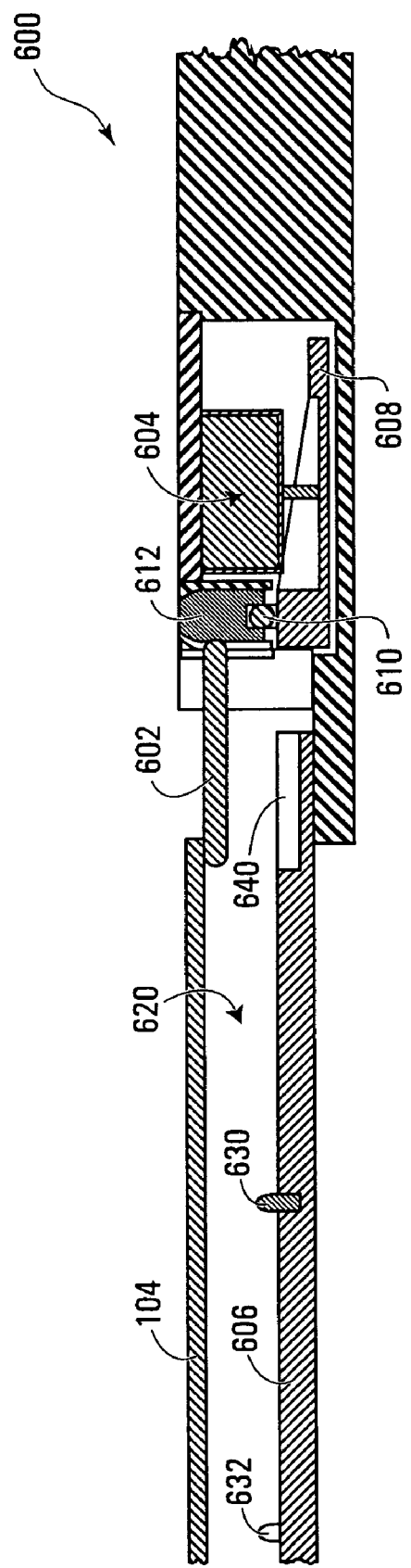
FIG. 6 is a cross-section of a damping member, a workpiece and a workpiece plane plate, according to a fifth embodiment of the invention.

Referring to FIGS. 1 and 6, a workpiece plane plate of an apparatus according to a fifth embodiment of the invention is shown generally at 600. In this embodiment, a distance or gap 620 between a damping member 606 and the workpiece 104 is adjustable. In this regard, adjustability of the gap is advantageous not only to be able to adjust the resulting damping force (or to compensate for changes in atmospheric pressure), but also to address thermal coupling difficulties, and to allow for optimal positioning of workpiece supports during pre-heating, surface heating, and cooling, as discussed below.

Thermal coupling difficulties tend to be of concern primarily during the pre-heating and subsequent cooling stages, rather than during the rapid irradiance flash itself. If the workpiece 104 is being pre-heated by irradiating its back-side 112 with the arc lamp 108 (as contemplated in FIG. 1), then depending upon the rate at which it is being pre-heated, the back-side 112 may tend to have a slightly higher temperature than the device side 114, with the result that thermal expansion of the back-side 112 is greater than that of the device side 114, causing the workpiece to slightly thermally bow, with the central region of the workpiece moving down toward the comparatively cooler damping member 106. As the rate of thermal conduction from the workpiece to the damping member 106 through the ambient gas in the gap 120 is inversely proportional to the distance of the workpiece from the damping member, the downwardly-bowed central region of the workpiece conducts heat to the damping member at a greater rate than outer regions of the workpiece, with the result that the central region of the workpiece becomes cooler than the outer regions. It will be appreciated that such temperature non-uniformities are undesirable, due to the resulting thermal gradients and stresses in the workpiece.

Conversely, if the workpiece 104 is pre-heated from above (for example, by using the flash lamp 110 shown in FIG. 1 in a continuous or DC mode to pre-heat the workpiece, then discharging capacitor banks through the flash lamp 110 for the flash), then the resulting thermal bowing would tend to occur in the opposite direction, i.e., with the central region of the workpiece moving slightly upward and away from the damping member, and the outer edges of the workpiece moving closer to the damping member 106. In this scenario, the device side 114 is already slightly hotter than the back-side 112 of the workpiece due to the irradiance it is receiving during pre-heating by the flash-lamp 110. As the outer edges of the back-side 112 move closer to the damping member 106 under such thermal bowing, the rate of conduction of heat from the outer edges of the back-side 112 to the damping member 106 increases, with the result that the temperature difference between the device side and the back-side becomes even greater, causing further aggravation of the thermal bowing effect. In addition, the outer edges tend to shrink as they cool relative to the remainder of the workpiece, which in turn forces the hot expanded center of the workpiece to thermally bow even further. Thus, the more the workpiece bows, the greater the conduction from the edges of the workpiece to the damping member, which in turn causes further bowing and even greater conductive heat losses at the edges. In this scenario, thermal runaway can occur, and may result in undesirably large temperature non-uniformities in the workpiece. These non-uniformities may damage or even break the workpiece, depending on their magnitude. Such thermal coupling and thermal runaway effects may also occur during the subsequent cooling stage following the irradiance flash.

It has been found that such thermal coupling and thermal runaway effects typically arise relatively slowly. For example, in some specific applications it has been found that such thermal coupling and runaway effects do not tend to appreciably arise within time scales on the order of $1 \times 10^2$ ms, but may begin to appreciably arise within time scales on the order of $1 \times 10^3$ ms or longer. Thus, these effects are primarily of concern during the pre-heating stage preceding the irradiance flash and during the subsequent cooling stage thereafter, as the rapid movement of the workpiece induced by the flash itself occurs too quickly for such effects to arise.

To address such thermal coupling and runaway difficulties, in the present embodiment the distance between the workpiece 104 and the damping member 606 shown in FIG. 6 is adjustable. More particularly, in this embodiment the distance between the damping member and the workpiece is adjustable between a first distance employable during the pre-heating stage, and a second distance smaller than the first distance employable during the irradiance flash and a motion-damping stage thereafter. In this embodiment, the first distance is at least two millimeters. More particularly, in this embodiment the first distance is about one centimeter. Also in this embodiment, the second distance is sufficiently small that gas pressure between the damping member and the workpiece opposes the motion of the workpiece during the irradiance flash and the motion-damping stage. In this embodiment, the second distance is about one-half millimeter. Alternatively, other distances, such as about one millimeter for example, may be substituted. In this embodiment, the distance between the damping member and the workpiece is further adjustable to a third distance greater than the second distance, employable during the cooling stage following the motion-damping stage. In the present embodiment, the third distance is at least two millimeters. Again, as the third distance is larger than the second distance, thermal coupling effects between the damping member and the workpiece are also reduced during the cooling stage. In this regard, the close proximity of the damping member to the workpiece during the irradiance flash and the motion-damping stage is desirable to provide an adequate damping force during and immediately after the irradiance flash, however, such damping forces are not required during the pre-heating or cooling stages. Accordingly, in this embodiment the workpiece 104 is maintained at a greater distance away from the damping member 606 during pre-heating and subsequent cooling than during and immediately following the irradiance flash, thereby reducing thermal coupling effects during pre-heating and cooling by reducing conduction rates through the gap 620.

To achieve this, in this embodiment the workpiece 104 is initially supported by a plurality of adjustable support members, such as that shown at 602 in FIG. 6. To adjust the spacing between the workpiece 104 and the damping member 606, the workpiece plane plate 600 includes a motor 604, which in this embodiment is a step motor. The motor 604 is connected to a 3D cam 608, which is generally disc-shaped but has a continuously variable height, ranging from a maximum height at one side of the cam 608 to a minimum height at an opposite side of the cam. An edge of the cam 608 contacts and supports a bearing 610 of a cam follower 612, which is connected to the adjustable support member 602. Thus, rotational motion of the motor 604 is converted by the cam 608 into vertical motion of the cam follower 612 and hence of the support member 602 and the workpiece 104.

Thus, in this embodiment, during the pre-heating stage, the workpiece 104 is supported at a significantly greater height above the damping member 606 than during the irradiance flash and the motion-damping stage, in order to reduce thermal coupling effects during pre-heating. More particularly, in this embodiment the workpiece 104 is supported during the pre-heating stage at the first distance above the damping member, which in this embodiment is more than two millimeters. More particularly still, in this embodiment the first distance is on the order of one centimeter. Immediately prior to the irradiance flash, the motor 604 is actuated to lower the workpiece 104 to a lower height above the damping member 606, i.e. the second distance, which in this embodiment is on the order of one-half millimeter, to provide a desired damping force to oppose thermally induced motion during and immediately following the flash. In particular, this second distance is maintained throughout the duration of the motion-damping stage, i.e., until a sufficient time has elapsed following the flash that the motion of the workpiece induced by the flash has been adequately damped and further damping is not required. In this embodiment, the motion-damping stage may persist for a duration on the order of one-tenth of one second after the flash, or even one second after the flash, but preferably not appreciably longer than one second after the flash, in order to prevent excessive thermal coupling effects from developing. At the end of the motion-damping stage, the motor 604 is again actuated to raise the workpiece 104 to the third distance above the damping member, which in this embodiment is the same as the first distance, on the order of one centimeter. Alternatively, the third distance may differ from the first distance if desired. Likewise, the first, second and third distances may all be varied, continuously or discretely, if desired, depending on the application in question. In this embodiment, the first and third distances are preferably sufficiently large to prevent excessive thermal coupling and runaway effects, while the second distance is preferably selected to be as small as possible (thereby providing maximum motion damping force), and is therefore selected to be no larger than necessary to prevent the workpiece from either physically striking the damping member or breaking due to excessive damping force.

Advantageously, such a method allows the support distances to be selected in order to provide an optimized balance of maximizing the available motion damping force while minimizing undesirable thermal coupling effects. For example, in the present embodiment, during the pre-heating stage, motion damping is not required, and thus, supporting the workpiece at least 2 mm above the damping member during this stage reduces undesirable thermal coupling and runaway effects. Conversely, during the irradiance flash and the motion-damping stage thereafter, strong motion damping is desired, but thermal coupling and runaway effects are not of primary concern due to the short time duration of this stage. Thus, lowering the workpiece to a distance on the order of one-half millimeter above the damping member for the flash and the motion-damping stage provides a significantly greater damping force to dampen the flash-induced motion of the workpiece, without suffering the disadvantages of thermal coupling or runaway effects. Finally, during the subsequent cooling stage, motion damping is not required, so raising the workpiece back up to a distance greater than two millimeters above the damping member prevents excessive thermal coupling and runaway effects. Effectively, supporting the workpiece at a greater distance above the damping member during the pre-heating and cooling stages than during the irradiance flash and the motion-damping stage allows the motion-damping stage separation or gap distance to be selected solely for its ideal motion damping effects. Thus, as compared to embodiments that employ only a single fixed separation distance between the workpiece and the damping member, such embodiments with adjustable separation distances allow a smaller separation distance to be used during the irradiance flash and motion-damping stage, thereby resulting in greater motion damping force during that stage, without suffering from the disadvantages of excessive thermal coupling and runaway effects that may tend to occur in fixed-distance embodiments.

Referring to FIGS. 2 and 6, although the workpiece 104 may be supported on the support member 602 and similar support members during both pre-heating and the flash, preferably, the damping member 606 includes a plurality of supports such as support pins shown at 630 and 632 for example, and the workpiece 104 is lowered onto the damping member supports immediately prior to the irradiance flash. The support pins 630 and 632 are generally similar to the support pins 130 and 132 shown in FIG. 2, however, in this embodiment the locations of the support pins 630 and 632 are different than those of the support pins 130 and 132. It will be recalled that the locations of the support pins 130 and 132 are selected to achieve a balance between temperature uniformity during pre-heating (which favors support pins at the outside edges of the workpiece) and workpiece survivability during and immediately following the flash (which favors support pin locations further inward, to minimize the motion of the center of mass of the workpiece). However, in this embodiment the workpiece 104 is supported by the adjustable support members 602 and similar support members during pre-heating, and is lowered onto the support pins 630, 632 and similar pins for the flash. Thus, in this embodiment, the locations of the support pins 630 and 632 may be selected solely to maximize workpiece survivability during and immediately following the flash. In this embodiment, to facilitate lowering of the workpiece 104 onto the support pins 630, 632 and similar pins, in this embodiment the damping member 606 includes a plurality of recesses such as that shown at 640, to allow the adjustable support member 602 to move downward into the plane of the damping member 606.

Figure 7:
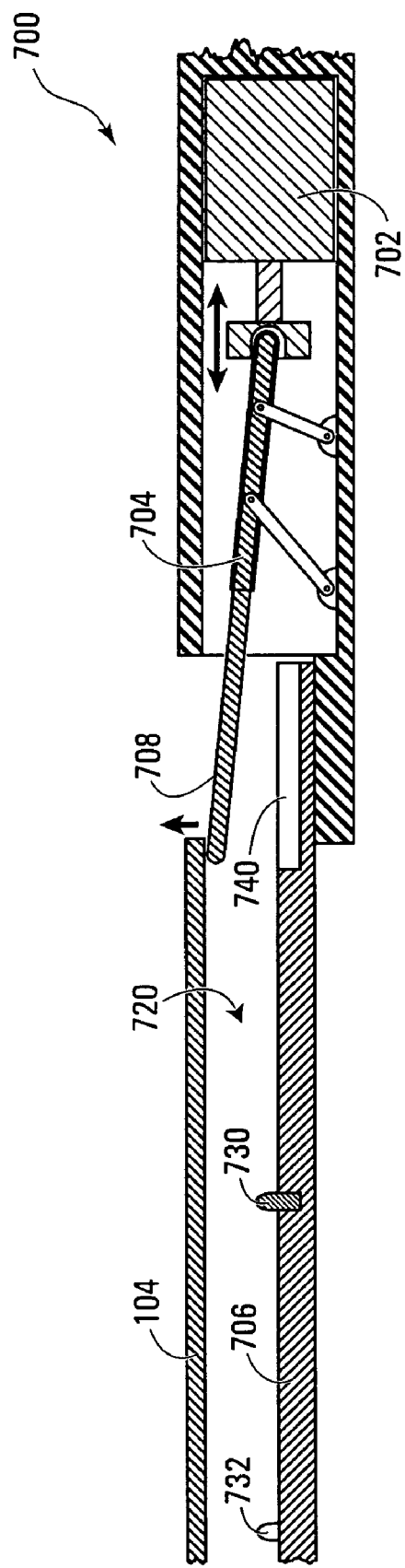
FIG. 7 is a cross-section of a damping member, a workpiece and a workpiece plane plate, according to a sixth embodiment of the invention.

Referring to FIG. 7, a workpiece plane plate according to a sixth embodiment of the invention is shown generally at 700. As in the previous embodiment, a gap 720 between the workpiece 104 and a modified damping member 706 is adjustable. To achieve this, the workpiece plane plate 700 includes an actuator 702, which in this embodiment includes a two-step controllable linear actuator. More particularly, the actuator 702 may include a voice coil actuator, or a nanomuscle actuator (memory shape alloy actuator), for example, although other types of actuators may be substituted. The actuator 702 is in communication through a straight-line linkage 704 with a support member 708, which in this embodiment includes a quartz rod. The straight-line linkage 704 translates generally horizontal motion of the actuator into vertical motion of a distal tip of the support member 708. The modified damping member 706 includes support pins such as those shown at 730 and 732 and a plurality of recesses such as that shown at 740, similar to the supports pins and recess 630, 632 and 640 shown in FIG. 6.

Alternatively, or in addition, the gap between the workpiece and the damping member may be adjusted by moving the damping member. For example, referring to FIG. 8, a workpiece plane plate and a damping member according to a seventh embodiment of the invention are shown generally at 800 and 806, respectively. The damping member 806 includes a quartz plate similar to damping members described previously herein, although in this embodiment the damping member 806 is attached to a moving gate (not shown), to permit the damping member 806 to be moved vertically upward and downward. Also in this embodiment, the workpiece 104 itself is moveable, as it is supported by a plurality of support members such as that shown at 802. In this embodiment the support member 802 includes a quartz rod, and is connected to a solenoid actuator 804 via a connecting arm 808, to permit controllable pivotal motion of the support member 802 about a pivot point 810. In this embodiment, the damping member 806 further includes a plurality of recesses such as that shown at 840, similar to those shown at 640 and 740 in FIGS. 6 and 7.

Figure 8:
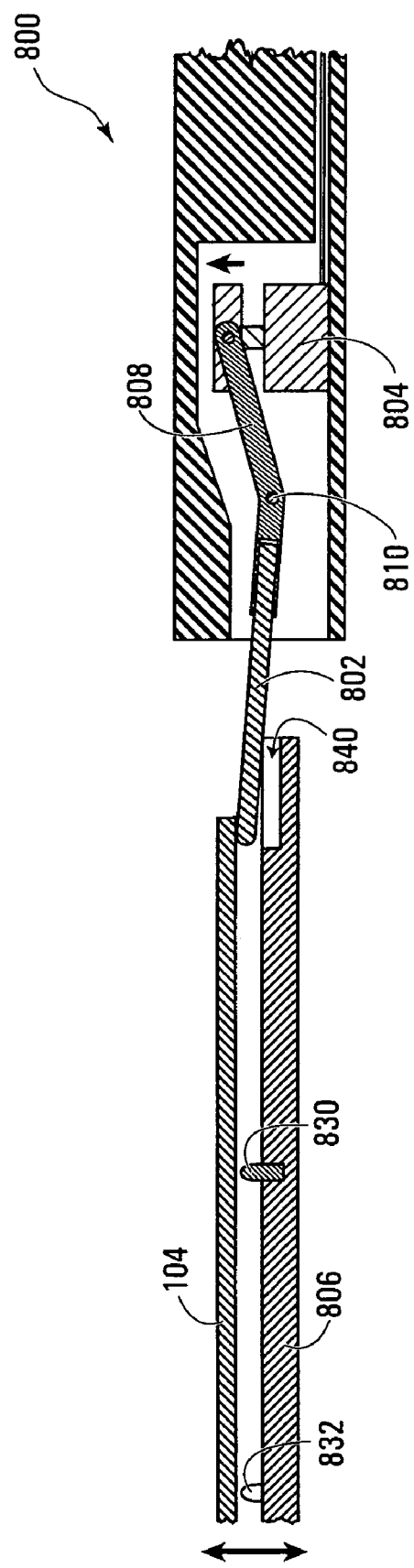
FIG. 8 is a cross-section of a damping member, a workpiece and a workpiece plane plate, according to a seventh embodiment of the invention.

Referring back to FIGS. 6-8, in embodiments employing a combination of moveable support members such as those shown at 602, 708 and 802 and fixed support members such as those shown at 630, 632, 730, 732, 830 and 832, when the workpiece 104 is subjected to the irradiance flash while supported on the fixed support members, it is preferable to prevent the workpiece 104 from physically striking the moveable support members. To achieve this, the recesses 640, 740 and 840 shown in FIGS. 6-8 are preferably sufficiently deep to accommodate the moveable members therein, flush with or slightly sunken beneath the upper surface of the workpiece plane plates 600, 700 and 800, respectively. Alternatively, the recesses may be replaced with vertical slots defined through the workpiece plane plates, to allow the moveable support members to move downward through the workpiece plane plate entirely.

Alternatively, or in addition, if desired, horizontal retraction components (not shown) may be provided, to allow the moveable support members to be retracted horizontally outward prior to the irradiance flash. In such embodiments, the workpiece may be supported on the moveable support members during pre-heating, then lowered onto the fixed support members, at which time the moveable support members may be retracted horizontally outward immediately prior to the irradiance flash. The workpiece may then be subjected to the irradiance flash, and after the resulting thermally induced motion has been adequately damped, the moveable support members may be extended radially inward to engage the lower surface of the workpiece and lift it up off the fixed support members. Retracting the moveable support members immediately prior to the irradiance flash in this manner prevents the edges of the workpiece from striking the moveable support members during the thermal bowing induced by the flash, thereby preventing damage to both the workpiece and the moveable support members.

Although the embodiments described in FIGS. 6-8 achieve adjustability of the gap between the damping member and the workpiece using a combination of movable support members (such as those shown at 602, 708 and 802) and fixed support members (such as those shown at 630, 632, 730, 732, 830 and 832), alternatively, other ways of achieving such adjustability may be substituted. For example, a single set of elongated support members (not shown) may extend through the damping member itself, and may be extendable and retractable to vary the height above the damping member at which the workpiece is supported.

In addition, if desired, workpiece recentering components (not shown) may be provided. In this regard, depending on the magnitude and duration of the irradiance flash, as well as the gap between the workpiece and the damping member during the flash stage, it is possible that the workpiece may move horizontally from its original position as a result of the flash. If this occurs in an embodiment that employs moveable support members to move the workpiece from its first distance from the damping member (for the pre-heating stage) to its second distance (for the irradiance flash and motion-damping stage), it is possible that such horizontal movement of the workpiece may cause the workpiece to be misaligned with the moveable support members when they move back to re-engage the workpiece to move it to its third distance (for the cooling stage). Accordingly, to ensure that the workpiece is adequately aligned with the moveable support members to allow it to be lifted off the fixed support members, one or more workpiece recentering components (not shown) may be provided. For example, the workpiece recentering components may include three or a different number of quartz rods, oriented vertically, which move radially inward from the workpiece plane plate to engage the outer perimeter of the workpiece and re-center it after the irradiance flash and motion-damping stage. Alternatively, lateral support members such as those disclosed in the above-noted U.S. patent application publication no. US 2004/0178553 A1 may be provided, to maintain the workpiece in a desired horizontal position range. Such lateral support members, if provided, are preferably selected and configured to avoid unduly violent collisions with the workpiece, in order to prevent breakage of the workpiece. For example, flexible optical fiber lateral support members may be selected, and may be radially outwardly spaced apart from the edges of the workpiece, although alternatively, other types and configurations of lateral support members may be substituted.

Figure 9:
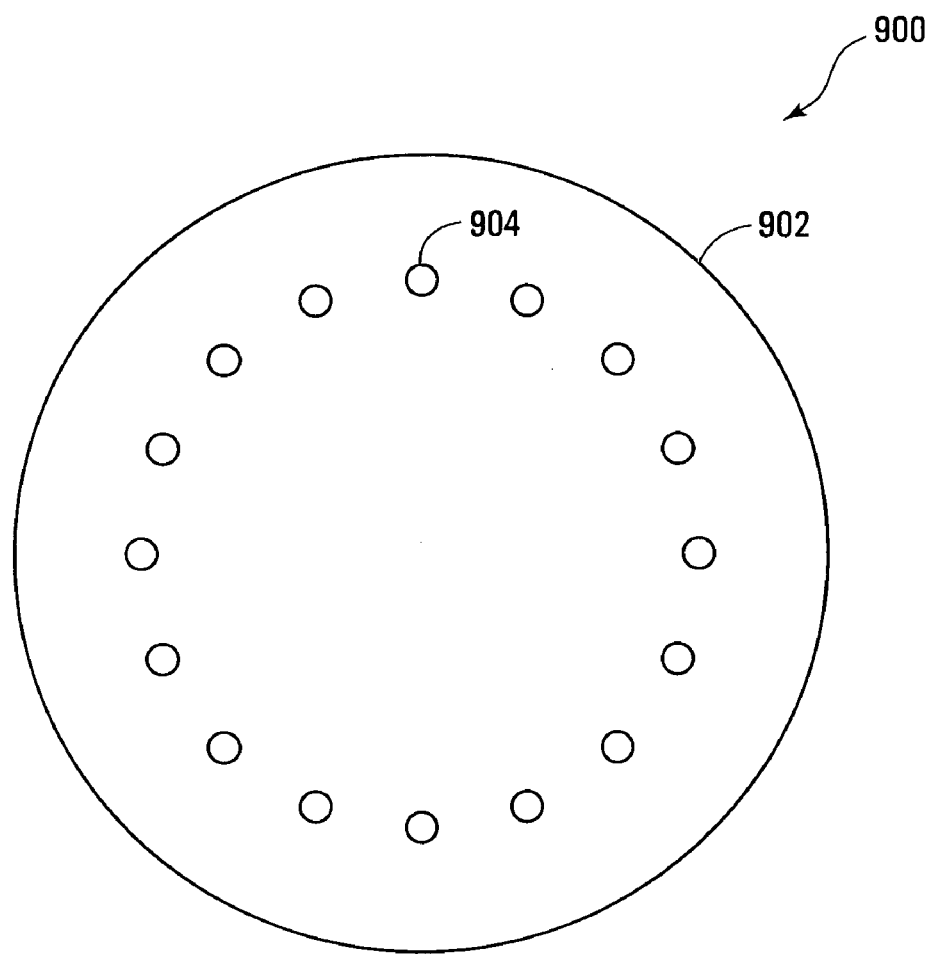
FIG. 9 is a top elevation view of a damping member according to an eighth embodiment of the invention.

Referring to FIGS. 1 and 9, a damping member according to an eighth embodiment of the invention is shown generally at 900. In this embodiment the damping member 900 is generally similar to the damping member 106 shown in FIG. 1, and includes a quartz plate. However, in this embodiment the damping member 900 is configured to apply a spatially-varying damping force. To achieve this, in this embodiment the damping member includes a planar plate having a plurality of recesses 904 defined therein, to cause the damping force to be smaller in the vicinity of each recess than away from the recesses. In this regard, it will be appreciated that in the vicinity of such a recess, if the workpiece 104 suddenly moves toward or away from the damping member 900, the added ambient gas volume in the recess itself results in a lesser percentage pressure change in the immediate vicinity of the recess. Thus, recesses such as the recess 904 may be placed at any locations where a slightly lower damping force is desired.

Alternatively, other ways of providing spatially-varying or time-varying damping forces may be substituted. For example, in a further exemplary embodiment of the invention, a modified damping member may include an electrostatic chuck damping plate (not shown). The damping plate has a dielectric material layer on an upper surface thereof. More particularly, in this embodiment the dielectric material includes $Al_2O_3$, with a suitable dopant to render it semiconducting (such as $Al_2O_3$ impregnated with SiC particles, for example), although alternatively, other dielectric materials may be substituted. In this embodiment, the electrostatic chuck damping plate is opaque, and pre-heating of the workpiece may be achieved by either irradiating the workpiece from above, or alternatively, by causing the damping plate itself to act as a hot plate. The electrostatic chuck damping plate includes a plurality of variable electrostatic force generators. More particularly, the force generators include a plurality of electrode pairs mounted within the dielectric material at various locations, and the voltages to each electrode are separately controllable. More particularly still, in this embodiment each of the electrode pairs is configured to act as a bipolar Johnson Rahbek electrostatic chuck force generator. Alternatively, other suitable electrostatic chuck electrode configurations may be substituted, such as a bipolar Coulomb electrostatic chuck configuration, for example. The workpiece 104 is supported above the damping member by a plurality of support pins extending upward from the damping member, and the downward electrostatic force applied to the workpiece by each electrode is separately controllable by controlling the voltage supplied to the electrode. In this embodiment, at least some of the electrode pairs are disposed radially inward from the support pins, and at least some electrode pairs are disposed radially outward from the support pins.

Such an electrostatic chuck damping member may be advantageously configured to apply an electrostatic force to the workpiece in response to the motion of the workpiece. The apparatus according to such an embodiment preferably includes a detector configured to detect the motion of the workpiece. Thus, during pre-heating, if a slight thermal bowing or other deformation occurs, the voltages to the electrode pairs beneath the portions of the workpiece furthest away from the damping plate are increased relative to the voltages to the electrode pairs beneath closer portions of the workpiece, thereby tending to flatten out the workpiece and reduce temperature non-uniformities that would have otherwise resulted from increased thermal coupling between the damping plate and the closest portions of the deformed workpiece.

In general, in this embodiment, each of the variable electrostatic force generators is selectively controllable to electrostatically deform the workpiece to a desired shape prior to the thermally induced motion of the workpiece. Although in the example previously discussed, the desired shape was a planar shape to reduce thermal coupling, alternatively, the desired shape may be non-planar. For example, immediately before the flash, the electrode pairs may be selectively controlled to pre-deform the workpiece to a desired shape, such as a bowed shape with the center raised in order to reduce the stress resulting from the flash, or alternatively, a bowed shape with the center lowered in order to reduce the magnitude of the thermally induced motion resulting from the flash.

In addition, during the flash and the motion-damping stage immediately thereafter, when the workpiece 104 thermally bows and begins to oscillate, the electrode pairs may continue to be selectively controlled, increasing the voltage to the electrode pairs radially inward from the support pins to provide greater damping downforce at the center of the workpiece when it is rising, and conversely, increasing the voltage to the electrode pairs radially outward from the support pins to provide greater damping downforce at the edges of the workpiece when the center of the workpiece is falling. Such control may be effected in a closed control loop, by a computer in communication with the workpiece motion detector.

Figure 10:
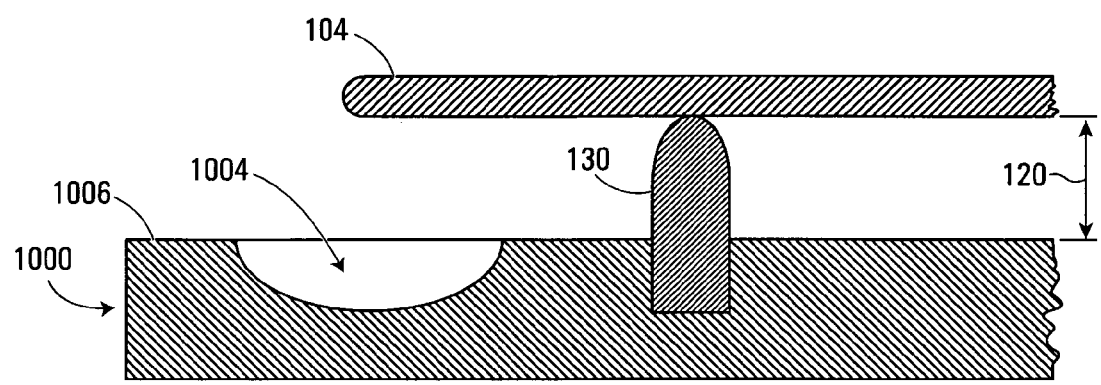
FIG. 10 is a cross-section of a damping member and a workpiece according to a ninth embodiment of the invention.

Referring to FIGS. 2 and 10, a damping member according to a ninth embodiment of the invention is shown generally at 1000 in FIG. 10. In this embodiment, the damping member 1000 includes an annular recess shown generally at 1004, defined in a surface of the damping member 1000, and the annular recess 1004 is configured to accommodate the outer edge of the workpiece 104 therein during the thermally induced motion. In this regard, in the present embodiment, the thermally induced motion of the workpiece 104 may include thermally induced curling of an outer edge of the workpiece, such as an initial steep downward curling of the outer perimeter region (e.g. the outer 1-2 cm) of the workpiece, as discussed earlier herein. Therefore, the annular recess 1004 serves to accommodate the curled outer edges of the workpiece. In this embodiment, the damping member 1000 is generally similar to the damping member 106 shown in FIG. 2, but has been modified to include the annular recess 1004, which is defined in an upper surface 1006 of the damping member 1000. In this embodiment, if such edge-curling of the outer edge of the workpiece 104 occurs, the outer perimeter or edge of the workpiece 104 is allowed to curl downward into the annular recess 1004, without physically striking the damping member 1000 itself. By preventing such physical contact, potential damage to the workpiece is avoided. In addition, the annular recess 1004 allows the height of the space or gap 120 between the damping member 1000 and the workpiece 104 to be decreased to a smaller spacing, thereby providing a greater damping force to dampen subsequent vibration and oscillation of the workpiece.

In variations of the present embodiment in which the damping member is transparent and the workpiece is pre-heated by transmitting irradiance from a pre-heating device through the damping member, the physical dimensions and curvature of the annular recess 1004 may be selected to achieve a desired optical effect. For example, the size, shape and other properties (e.g. reflectivity, transmissivity, emissivity) of the annular recess 1004 may be configured to produce a lensing effect to deliver additional irradiance to the outer perimeter regions of the workpiece, to compensate for edge effects, i.e. the tendency of the workpiece to lose more heat energy through irradiance near its outer edges due to their greater ratio of surface area to volume. In designing the size and shape of the annular recess 1004 for this purpose, other relevant heat transfer aspects are preferably taken into account, including, for example, the impact of changes in the depth and configuration of the annular recess upon the rate of heat conduction between the damping member and the outer perimeter regions of the workpiece.

In this embodiment, the annular recess 1004 has a depth on the order of one to five millimeters, and extends radially inward for a distance on the order of one to two centimeters from the outer perimeter or edge of the workpiece. Alternatively, other dimensions and configurations may be substituted, either to accommodate the thermally induced motion of the workpiece, or to achieve desired lensing effects, or both.

More generally, while specific embodiments of the invention have been described and illustrated, such embodiments should be considered illustrative of the invention only and not as limiting the invention as construed in accordance with the accompanying claims.

What is claimed is:

1. An apparatus comprising:
   a) a workpiece heating system configured to thermally induce motion of a workpiece; and
   b) a damping member spaced apart from the workpiece and configured to apply a damping force to dampen the motion of the workpiece, wherein the damping member is spaced apart from a rest position of the workpiece by a distance sufficiently small that gas pressure between the damping member and the workpiece opposes the motion of the workpiece, and wherein the distance is less than three millimeters.

2. The apparatus of claim 1 wherein the workpiece comprises a semiconductor wafer and wherein the damping member comprises a damping plate spaced apart from the wafer.

3. The apparatus of claim 2 wherein the damping plate is spaced apart from the rest position of the wafer by a distance on the order of one millimeter.

4. The apparatus of claim 2 wherein the damping plate is spaced apart from the rest position of the wafer by a distance greater than one-half millimeter.

5. The apparatus of claim 2 further comprising a support system configured to support the wafer above the damping plate.

6. The apparatus of claim 2 further comprising a support system configured to support the wafer below the damping plate.

7. The apparatus of claim 2 wherein the damping plate comprises an annular recess defined in a surface thereof and configured to accommodate the outer edge of the wafer therein during said thermally induced motion.

8. The apparatus of claim 1 wherein the damping member comprises first and second damping members, and further comprising a support system configured to support the workpiece above the first damping member and below the second damping member.

9. The apparatus of claim 1 wherein the workpiece heating system comprises an irradiance system configured to irradiate the workpiece.

10. The apparatus of claim 9 wherein the irradiance system comprises at least one irradiance flash device configured to expose the workpiece to an irradiance flash.

11. The apparatus of claim 10 wherein the irradiance flash device comprises a flash lamp.

12. The apparatus of claim 10 wherein the irradiance flash device comprises a microwave pulse generator.

13. The apparatus of claim 10 wherein the damping member is interposed between the at least one irradiance flash device and the workpiece and is transparent to at least some wavelengths of the irradiance flash.

14. The apparatus of claim 10 wherein the irradiance system further comprises a pre-heating system configured to pre-heat the workpiece during a pre-heating stage preceding the irradiance flash.

15. The apparatus of claim 14 wherein the distance between the damping member and the workpiece is adjustable to adjust the damping force.

16. The apparatus of claim 14 wherein the distance between the damping member and the workpiece is adjustable between at least a first distance employable during the pre-heating stage, and a second distance smaller than the first distance employable during the irradiance flash and a motion-damping stage thereafter.

17. The apparatus of claim 16 wherein the first distance is at least two millimeters.

18. The apparatus of claim 16 wherein the second distance is sufficiently small that gas pressure between the damping member and the workpiece opposes the motion of the workpiece during the irradiance flash and the motion-damping stage.

19. The apparatus of claim 18 wherein the second distance is about one millimeter.

20. The apparatus of claim 18 wherein the second distance is about one-half millimeter.

21. The apparatus of claim 18 wherein the second distance is less than about two millimeters.

22. The apparatus of claim 16 wherein the distance between the damping member and the workpiece is adjustable between the first distance, the second distance, and a third distance greater than the second distance employable during a cooling stage following the motion-damping stage.

23. The apparatus of claim 22 wherein the third distance is at least two millimeters.

24. The apparatus of claim 1 wherein the damping member comprises a window.

25. The apparatus of claim 24 wherein the window comprises a quartz window.

26. The apparatus of claim 1 further comprising a supplemental heater configured to supply supplemental heat energy to the damping member.

27. The apparatus of claim 26 wherein the supplemental heater comprises an electrical resistance heater disposed in the vicinity of the outer perimeter region of the workpiece.

28. The apparatus of claim 26 wherein the supplemental heater comprises material in the vicinity of the outer perimeter of the workpiece having a greater emissivity than material of the damping member in the vicinity of a center of the workpiece.

29. The apparatus of claim 1 wherein the damping member is configured to apply a spatially-varying damping force.

30. The apparatus of claim 29 wherein the damping member comprises a planar plate having a plurality of recesses defined therein, to cause the damping force to be smaller in the vicinity of each recess than away from the recesses.

31. An apparatus comprising:
   a) means for thermally inducing motion of a workpiece; and
   b) means for applying a damping force to dampen the motion of the workpiece, the means for applying being spaced apart from the workpiece by a distance sufficiently small that gas pressure between the means for applying and the workpiece opposes the motion of the workpiece, and wherein the distance is less than three millimeters.

32. A method comprising:
   a) thermally inducing motion of a workpiece; and b) applying a damping force to dampen the motion of the workpiece with a damping member spaced apart from the workpiece, wherein applying a damping force comprises maintaining a distance between the damping member and the workpiece sufficiently small that gas pressure between the damping member and the workpiece opposes the motion of the workpiece, and wherein the distance is less than three millimeters.

33. The method of claim 32 wherein the workpiece comprises a semiconductor wafer and wherein the damping member comprises a damping plate spaced apart from the wafer.

34. The method of claim 33 wherein maintaining comprises maintaining the damping plate at a distance on the order of one millimeter from a rest position of the wafer.

35. The method of claim 33 wherein maintaining comprises maintaining the damping plate at a distance greater than one-half millimeter from the rest position of the wafer.

36. The method of claim 33 wherein maintaining comprises supporting the wafer above the damping plate.

37. The method of claim 33 wherein maintaining comprises supporting the wafer below the damping plate.

38. The method of claim 33 further comprising accommodating the outer edge of the wafer in an annular recess defined in a surface of the damping plate during said thermally induced motion.

39. The method of claim 32 wherein the damping member comprises first and second damping members, and wherein maintaining comprises supporting the workpiece above the first damping member and below the second damping member.

40. The method of claim 32 wherein thermally inducing motion comprises exposing the workpiece to an irradiance flash.

41. The method of claim 40 wherein exposing comprises exposing the workpiece to an irradiance flash produced by a flash lamp.

42. The method of claim 41 wherein exposing comprises exposing the workpiece to an irradiance flash produced by a microwave pulse generator.

43. The method of claim 40 wherein the damping member is transparent to at least some wavelengths of the irradiance flash, and wherein irradiating comprises transmitting at least some of the irradiance flash through the damping member to the workpiece.

44. The method of claim 40 further comprising pre-heating the workpiece during a pre-heating stage preceding the irradiance flash.

45. The method of claim 44 further comprising adjusting the distance between the damping member and the workpiece.

46. The method of claim 44 further comprising maintaining a first distance between the damping member and the workpiece during the pre-heating stage, and maintaining a second distance smaller than the first distance between the damping member and the workpiece during the irradiance flash and a motion-damping stage thereafter.

47. The method of claim 46 wherein maintaining a first distance comprises maintaining a distance of at least two millimeters between the damping member and the workpiece during the pre-heating stage.

48. The method of claim 47 wherein maintaining a second distance comprises maintaining a distance sufficiently small that gas pressure between the damping member and the workpiece opposes the motion of the workpiece during the irradiance flash and the motion-damping stage.

49. The method of claim 48 wherein maintaining a second distance comprises maintaining a distance of about one millimeter between the damping member and the workpiece during the irradiance flash and the motion-damping stage.

50. The method of claim 48 wherein maintaining a second distance comprises maintaining a distance of about one-half millimeter between the damping member and the workpiece during the irradiance flash and the motion-damping stage.

51. The method of claim 48 wherein maintaining a second distance comprises maintaining a distance of less than about two millimeters between the damping member and the workpiece during the irradiance flash and the motion-damping stage.

52. The method of claim 46 further comprising maintaining a third distance greater than the second distance between the damping member and the workpiece during a cooling stage following the motion-damping stage.

53. The method of claim 52 wherein maintaining a third distance comprises maintaining a distance of at least two millimeters between the damping member and the workpiece during the cooling stage.

54. The method of claim 32 wherein the damping member comprises a window.

55. The method of claim 54 wherein the window comprises a quartz window.

56. The method of claim 32 further comprising supplying supplemental heat energy to the damping member.

57. The method of claim 56 wherein supplying comprises supplying electric current to an electrical resistance heater disposed in the vicinity of the outer perimeter region of the workpiece.

58. The method of claim 56 wherein supplying comprises irradiating material in the vicinity of the outer perimeter of the workpiece having a greater emissivity than material of the damping member in the vicinity of a center of the workpiece.

59. The method of claim 32 wherein applying comprises applying a spatially-varying damping force.

60. The method of claim 59 wherein the damping member comprises a planar plate having a plurality of recesses defined therein, such that the damping force resulting from gas pressure change is smaller in the vicinity of each recess than the damping force away from the recesses.

* * * * *

UNITED STATES PATENT AND TRADEMARK OFFICE
CERTIFICATE OF CORRECTION

PATENT NO. : 7,501,607 B2  Page 1 of 1
APPLICATION NO. : 11/018388
DATED : March 10, 2009
INVENTOR(S) : Camm et al.

It is certified that error appears in the above-identified patent and that said Letters Patent is hereby corrected as shown below:

Column 2, Line 68, "Characterisitics of fine" should be changed to --Characteristics of fine--

Column 3, Line 2, "the *workpiece and" should be changed to --the workpiece and--

Column 10, Line 50, "disposed at 900" should be changed to --disposed at 90°--

Signed and Sealed this

Twenty-eighth Day of July, 2009

JOHN DOLL
*Acting Director of the United States Patent and Trademark Office*